United States Patent
Yao et al.

(10) Patent No.: US 10,142,089 B2
(45) Date of Patent: Nov. 27, 2018

(54) BAUD-RATE CLOCK DATA RECOVERY WITH IMPROVED TRACKING PERFORMANCE

(71) Applicant: Oracle International Corporation, Redwood City, CA (US)

(72) Inventors: Yuhan Yao, San Jose, CA (US); Xun Zhang, Westford, MA (US); Dawei Huang, San Diego, CA (US); Jianghui Su, San Jose, CA (US); Muthukumar Vairavan, San Jose, CA (US); Chaitanya Palusa, Fremont, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 22 days.

(21) Appl. No.: 15/466,469

(22) Filed: Mar. 22, 2017

(65) Prior Publication Data
US 2018/0278405 A1    Sep. 27, 2018

(51) Int. Cl.
| | |
|---|---|
| *H04L 7/00* | (2006.01) |
| *H04L 7/02* | (2006.01) |
| *H04B 1/16* | (2006.01) |
| *H03L 7/08* | (2006.01) |

(52) U.S. Cl.
CPC .......... *H04L 7/0008* (2013.01); *H03L 7/0807* (2013.01); *H04B 1/16* (2013.01); *H04L 7/02* (2013.01)

(58) Field of Classification Search
CPC ........ H04L 25/03019; H04L 25/03949; H04L 7/0004; H04L 7/0008; H04L 7/002
USPC ......... 375/229–233, 316, 324–327, 354–355
See application file for complete search history.

(56) References Cited

U.S. PATENT DOCUMENTS

| | | | |
|---|---|---|---|
| 9,397,868 B1 * | 7/2016 | Hossain | H04L 25/03057 |
| 9,455,848 B1 * | 9/2016 | Zhang | H04L 25/03057 |
| 9,461,654 B1 * | 10/2016 | Kou | H03L 7/0807 |
| 9,577,815 B1 * | 2/2017 | Simpson | H04L 7/0012 |
| 9,699,009 B1 * | 7/2017 | Ainspan | H04L 25/4917 |
| 2004/0141567 A1 * | 7/2004 | Yang | H03L 7/087 375/287 |
| 2005/0058234 A1 * | 3/2005 | Stojanovic | H04L 7/0331 375/371 |
| 2005/0201491 A1 * | 9/2005 | Wei | H04L 7/0337 375/326 |

(Continued)

*Primary Examiner* — Emmanuel Bayard
(74) *Attorney, Agent, or Firm* — Marsh Fischmann & Breyfogle LLP; Kent A. Lembke; Daniel J. Sherwinter

(57) ABSTRACT

Embodiments include systems and methods for improving link performance and tracking capability of a baud-rate clock data recovery (CDR) system using transition pattern detection. For example, a multi-level signal is received via a data channel and converted to a pseudo-NRZ signal. CDR early/late voting can be derived from the converted (baud-rate) pseudo-NRZ signal and from error signals from the received PAM4 signal, and the voting can be implemented with different phase error detector (PED) functional approaches. Different approaches can yield different CDR performance characteristics and can tend to favor different PAM4 transition patterns. Embodiments can identify jittery patterns for a particular CDR implementation and can add features to the CDR to filter out those patterns from being used for CDR early/late voting.

20 Claims, 13 Drawing Sheets
(2 of 13 Drawing Sheet(s) Filed in Color)

(56) References Cited

U.S. PATENT DOCUMENTS

2011/0311008 A1* 12/2011 Slezak .................... H03M 9/00
375/353
2017/0134190 A1* 5/2017 Hoshyar ........... H04L 25/03057
2017/0279592 A1* 9/2017 Hammad .............. H04L 7/0054

* cited by examiner

BAUD-RATE CLOCK DATA RECOVERY WITH IMPROVED TRACKING PERFORMANCE

FIELD

Embodiments relate generally to receiver circuits, and, more particularly, to techniques for improving tracking performance in baud-rate clock tracking circuits, for example, in a high-speed baud-rate clock data recovery (CDR) circuit of a receiver system of a serializer/deserializer (SERDES).

BACKGROUND

Many electronics applications include communications channels that have transmitter and receiver components to move data through the electronics application, and the receiver components can include clock tracking features to recover a sampling clock from the received data. At-rate clock tracking circuits (e.g., a baud-rate clock data recovery (CDR) circuit, such as a "Muller-Mueller CDR") can feedback data samples and error samples to recover clock timing information, such that the rate of the resulting clock signal is the data rate. Tracking the clock allows the receiver to sample a received data signal in the center of the "data eye," thereby improving the accuracy of recovering data bit information from the data signal.

At-rate CDR techniques extract timing information by analyzing a channel pulse response at one or more sample locations and determining whether current clocking appears to be early or late with respect to the pulse response, then shifting the clocking signal (e.g., advancing or retarding the phase of the clocking signal), as appropriate. Such early/late determinations can be frustrated by various factors, such as clock jitter. For example, at-rate clock tracking circuits for high-speed serial links are typically implemented to handle two-level data encoding, such as "non-return-to-zero" (NRZ) encoding. With such an encoding scheme, early/late determinations (generally referred to herein as "CDR voting") are based on attempting to recover data symbols in context of four types of transitions (e.g., +1 to +1, +1 to −1, −1 to −1, or −1 to +1), and jitter can cause errors in the CDR voting. For various reasons, it can be desirable to use higher-order encoding schemes that encode bits into more than two levels, such as "four-level pulse amplitude modulation" (PAM4) encoding. Higher-order encoding schemes can saddle a clock tracking circuit with more types of transitions to decode, which can cause the CDR voting to be appreciably more susceptible to jitter.

BRIEF SUMMARY

Among other things, embodiments provide novel systems and methods for improving link performance and tracking capability of a baud-rate clock data recovery (CDR) system using transition pattern detection. For example, a multi-level (e.g., PAM4) signal is received by a receiver (e.g., of a serializer/deserializer (SERDES) circuit) via a data channel and converted to a pseudo-NRZ signal. CDR early/late voting can be derived from the converted (baud-rate) pseudo-NRZ signal and from error signals from the received PAM4 signal. Such voting can be implemented with different phase error detector (PED) functional approaches. For example, different techniques can be used to convert from PAM4 to pseudo-NRZ (e.g., sign-based, transition-based, etc.), and different PED functions can be implemented with each of those conversion approaches. With each PED functional approach, the same CDR locking point can be achieved, and the phase tracking capability of the at-rate CDR can depend on the dominant residual pre-cursor and post-cursor inter-symbol-interference (ISI) terms. However, each approach can yield different CDR performance characteristics and can tend to favor different PAM4 transition patterns (e.g., different PED functions can be more likely to generate jittery votes with different subsets of PAM4 transition patterns). Embodiments can identify the jittery patterns for a particular CDR implementation and can add features to the CDR to filter out those patterns from being used for CDR early/late voting. Filtering out data bit transition patterns that generate low-quality jittery votes can improve CDR tracking capability by reducing CDR jitter and improving jitter tolerance.

BRIEF DESCRIPTION OF THE DRAWINGS

The patent or application file contains at least one drawing executed in color. Copies of this patent or patent application publication with color drawings will be provided by the Office upon request and payment of the necessary fee.

The present disclosure is described in conjunction with the appended figures:

The patent or application file contains at least one drawing executed in color. Copies of this patent or patent application publication with color drawings will be provided by the Office upon request and payment of the necessary fee.

Figure 1:
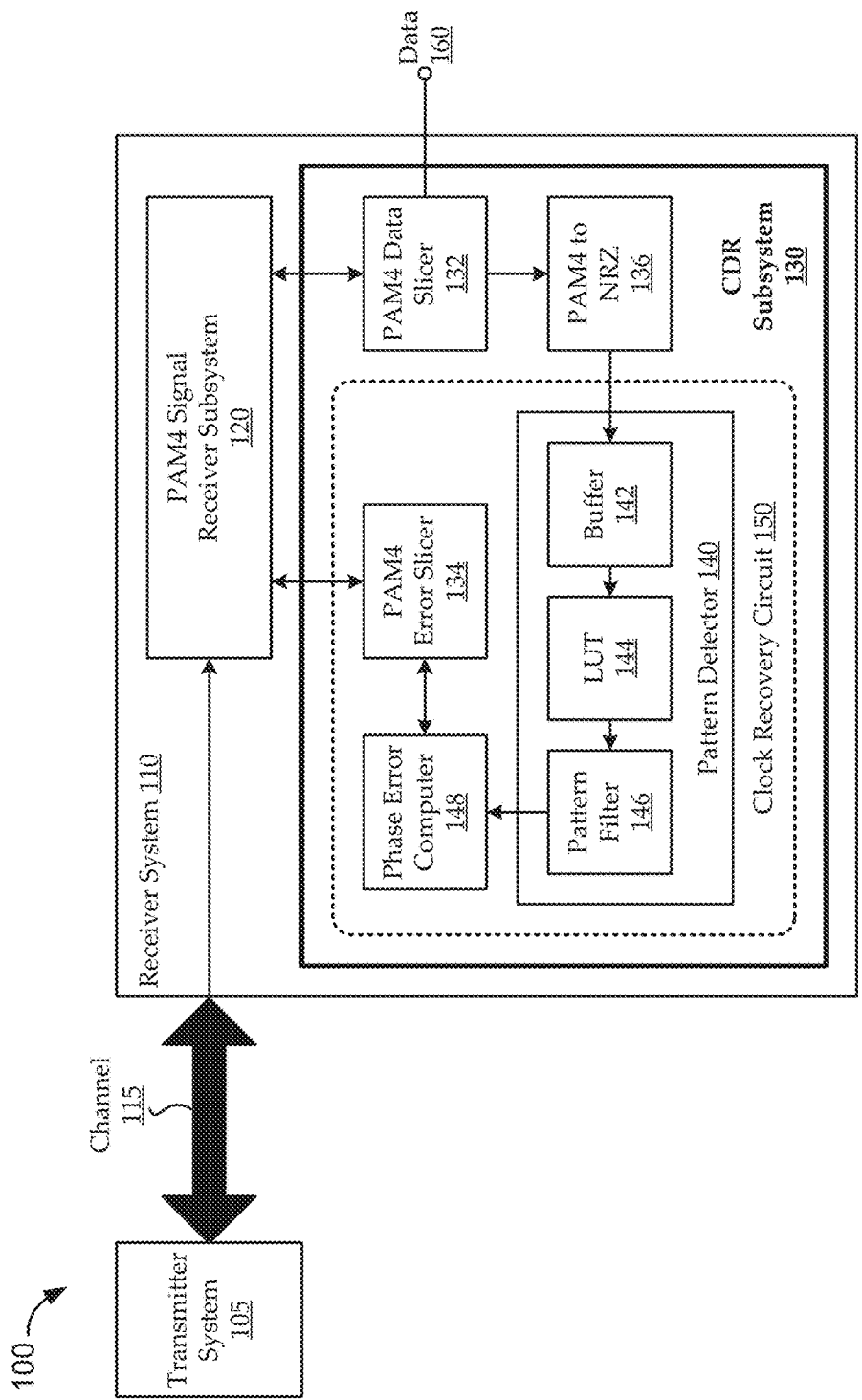
Figure 2:
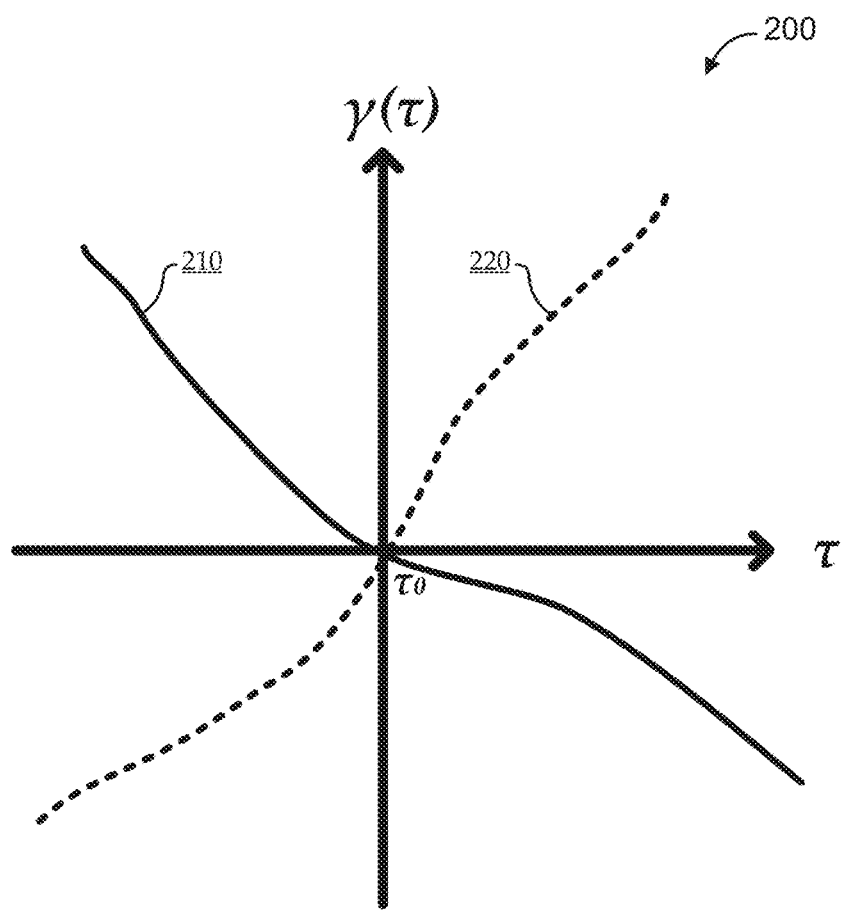
Figure 3:
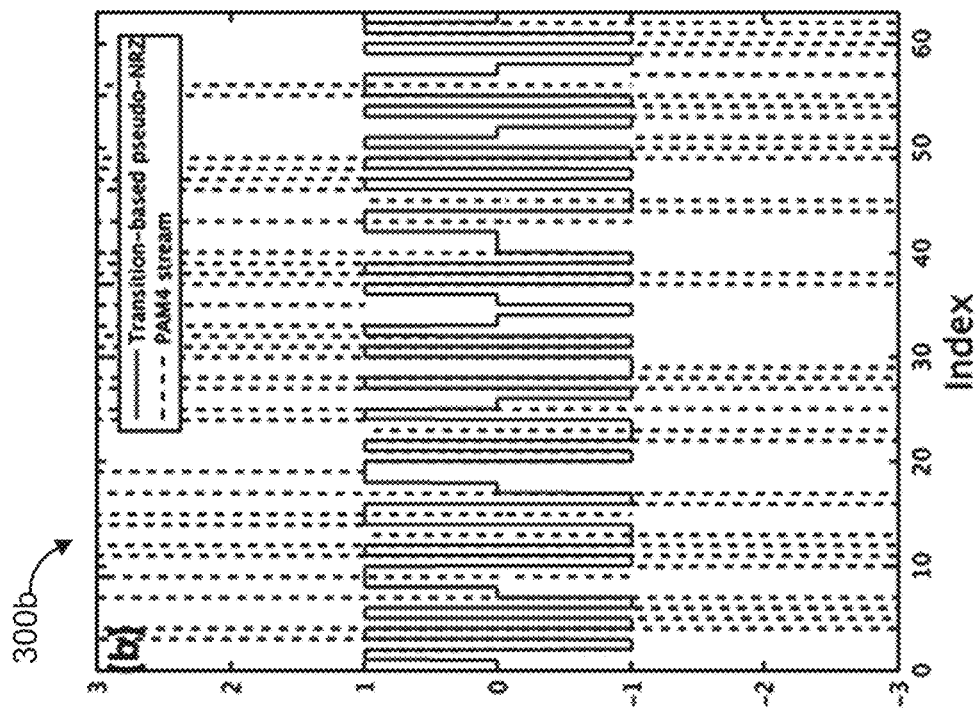
Figure 3:
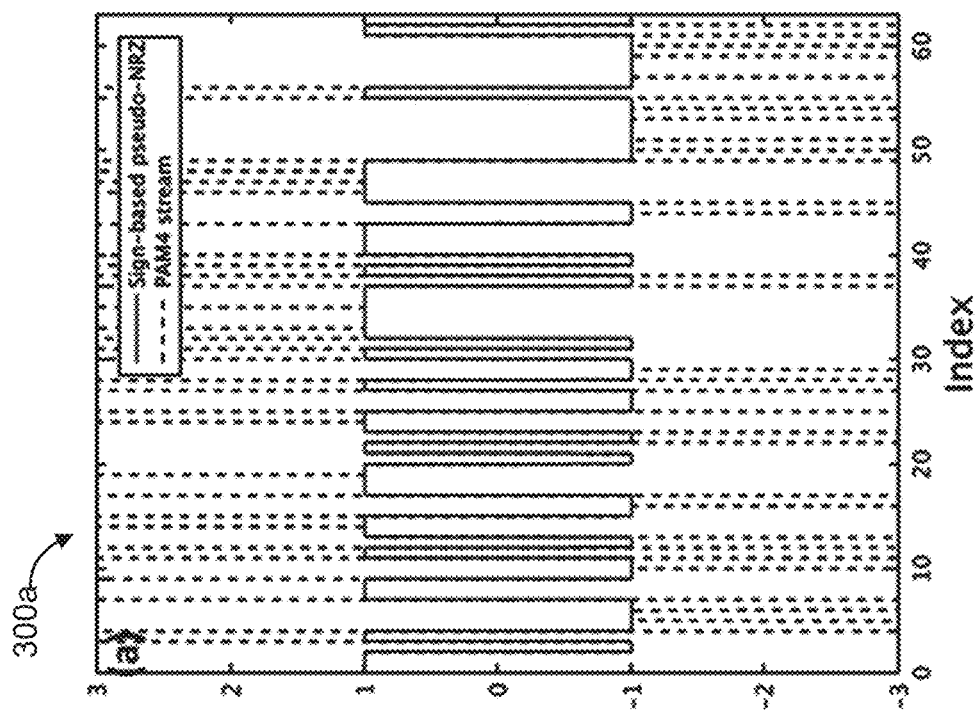
Figure 4:
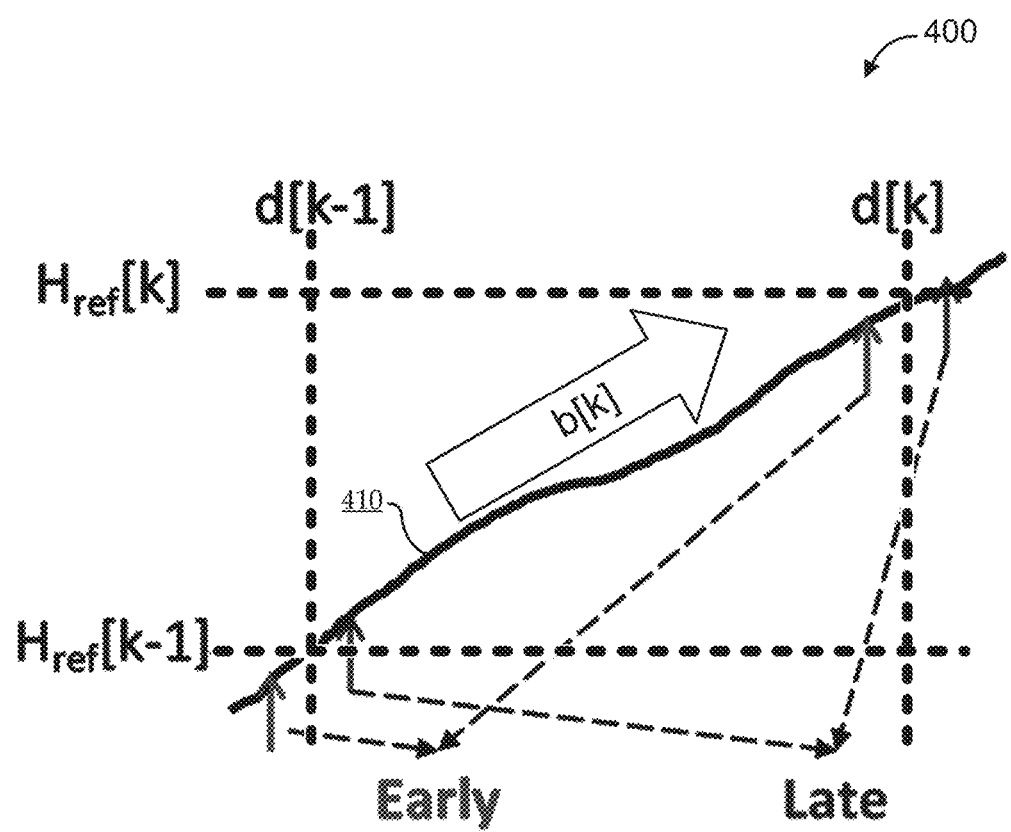
Figure 5:
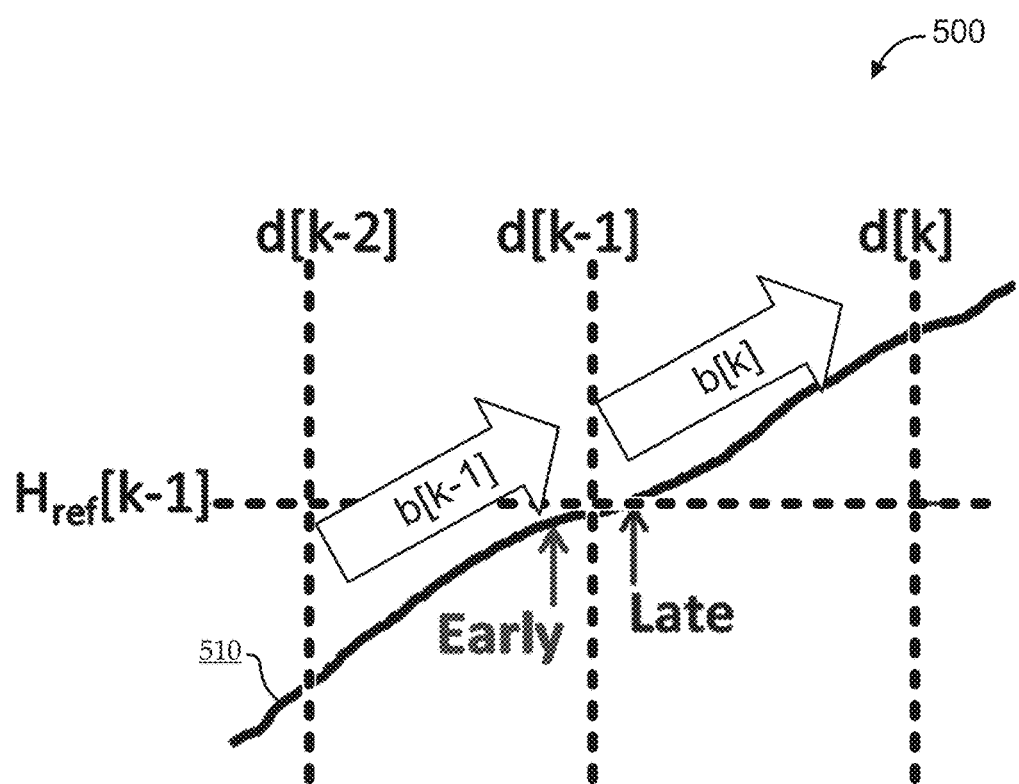
Figure 6:
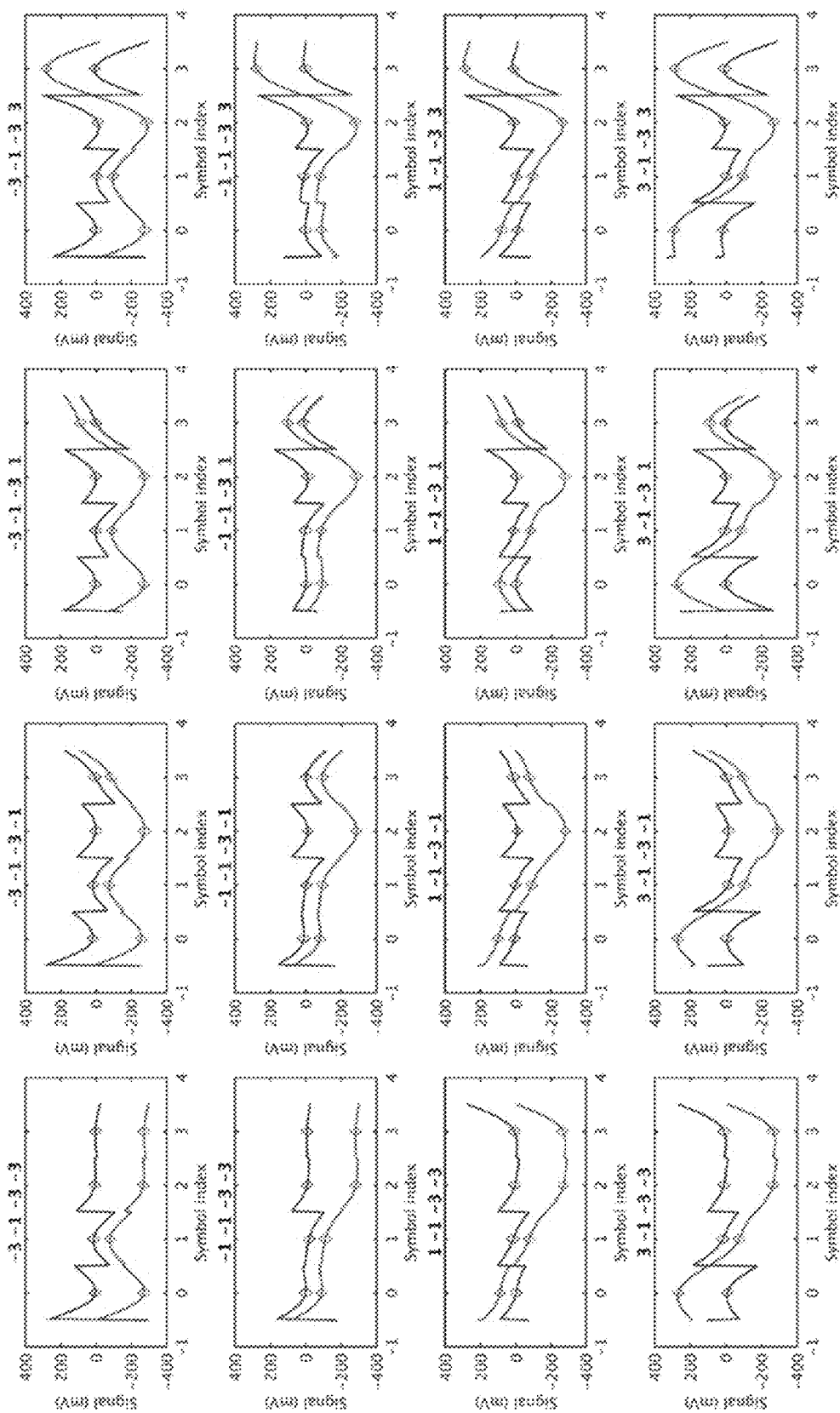
Figure 7:
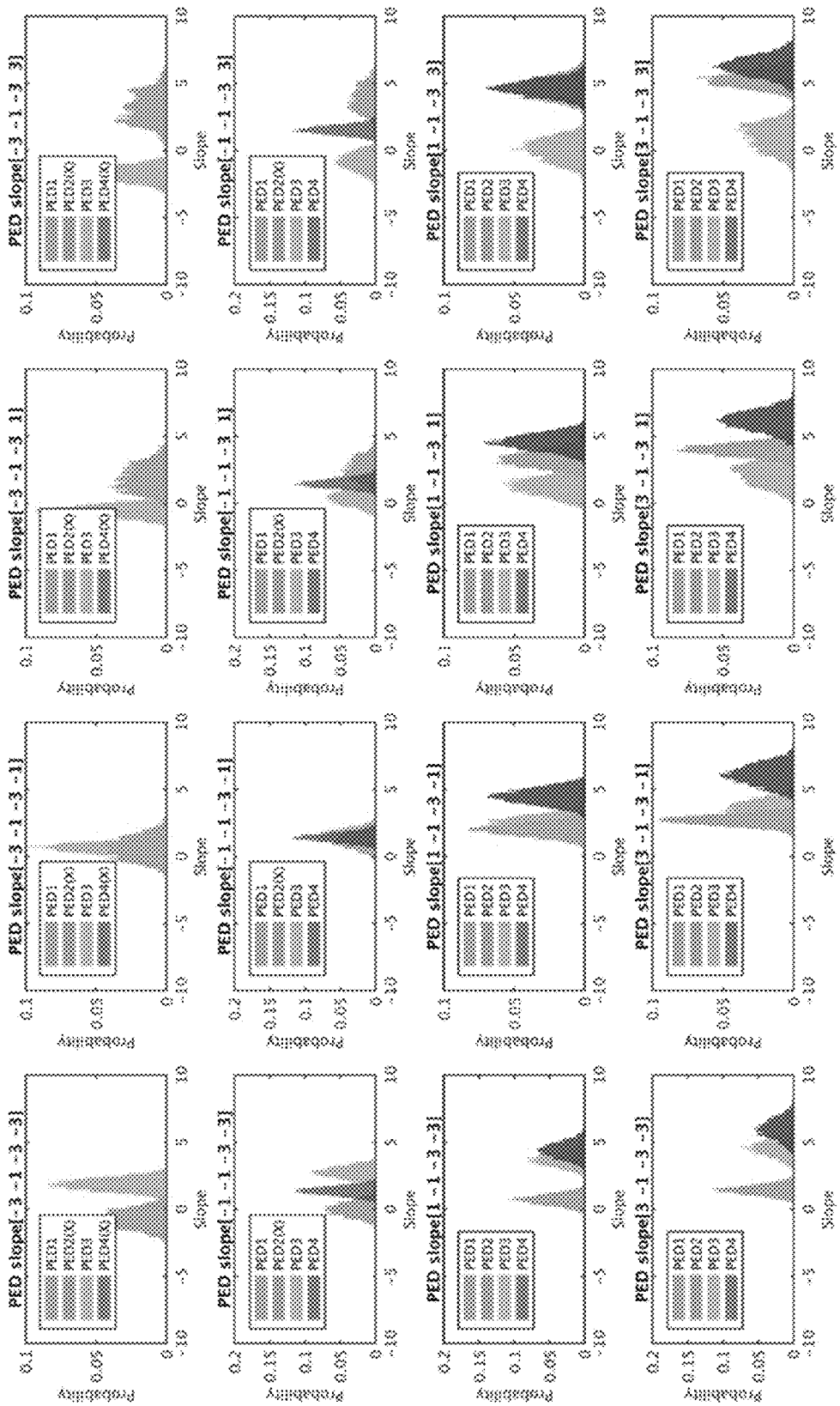
Figure 8:
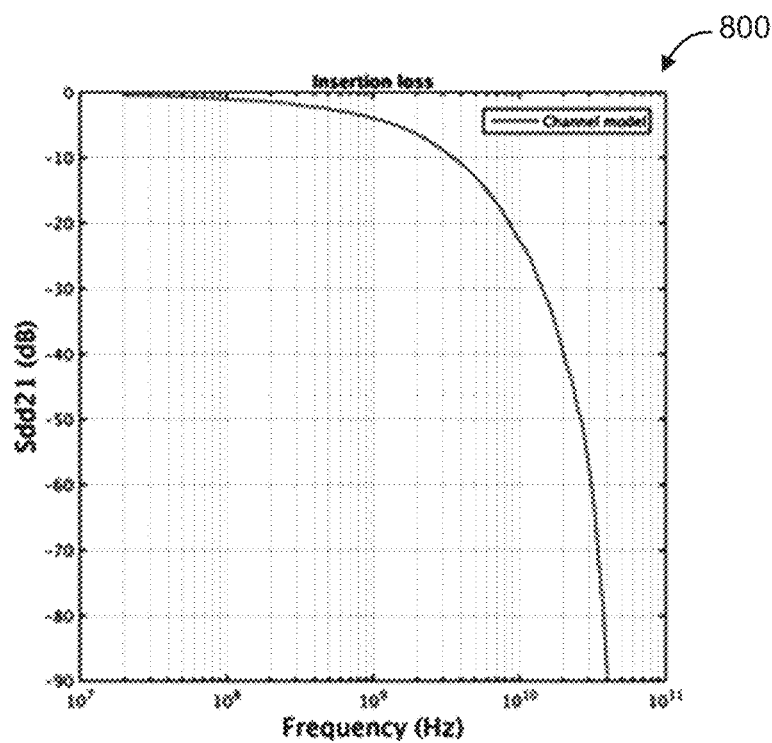
Figure 9:
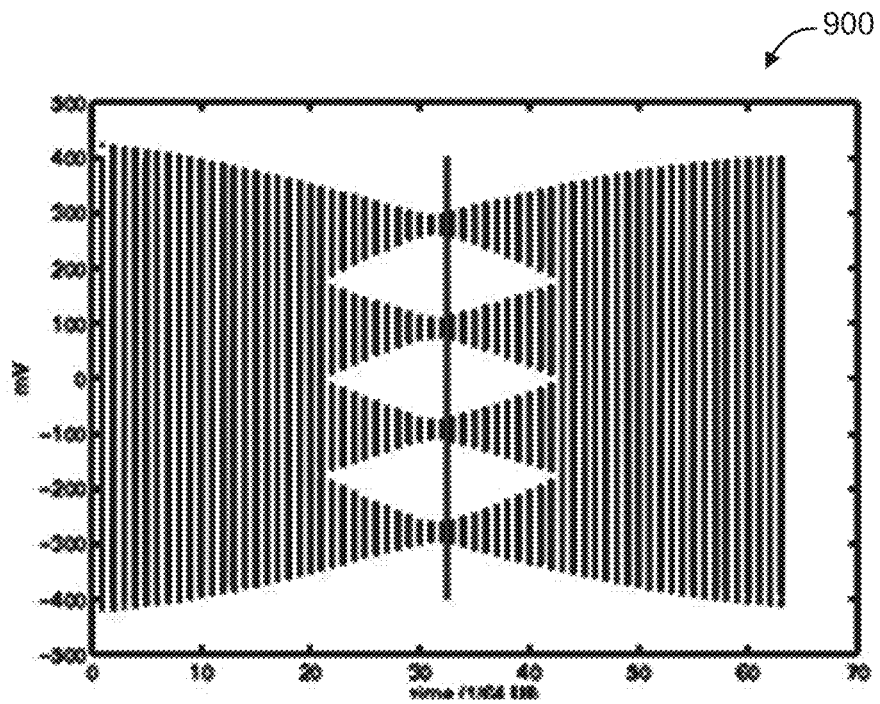
Figure 10:
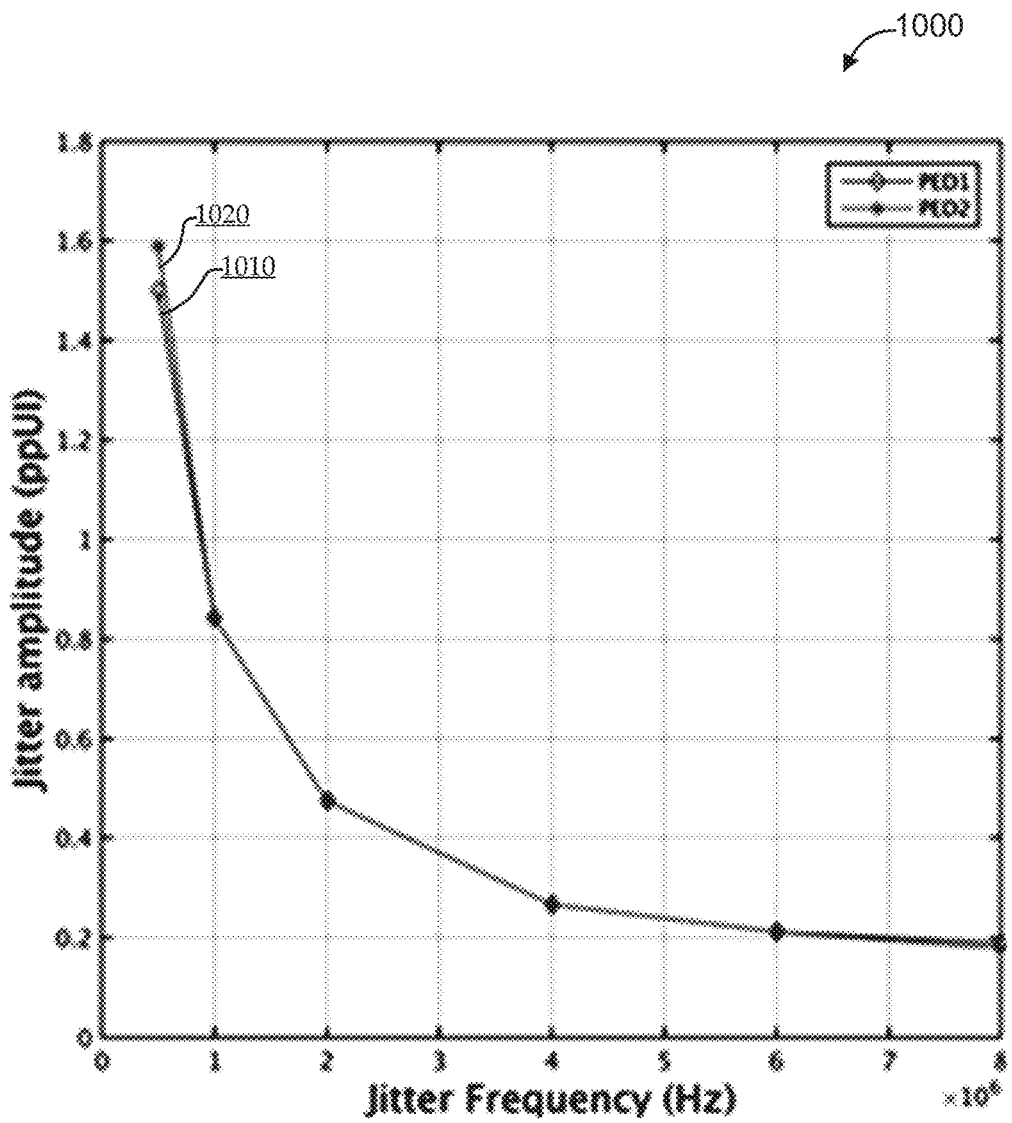
Figure 11:
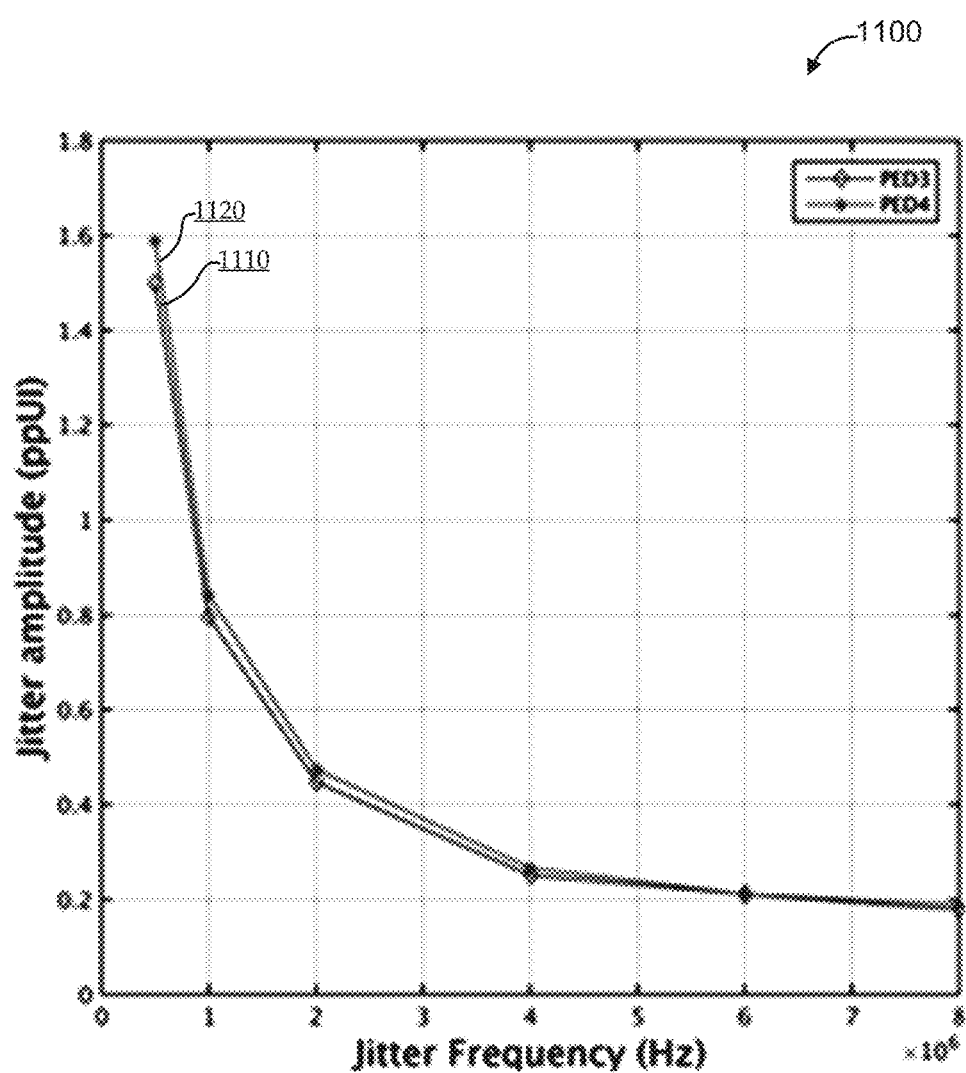
Figure 12:
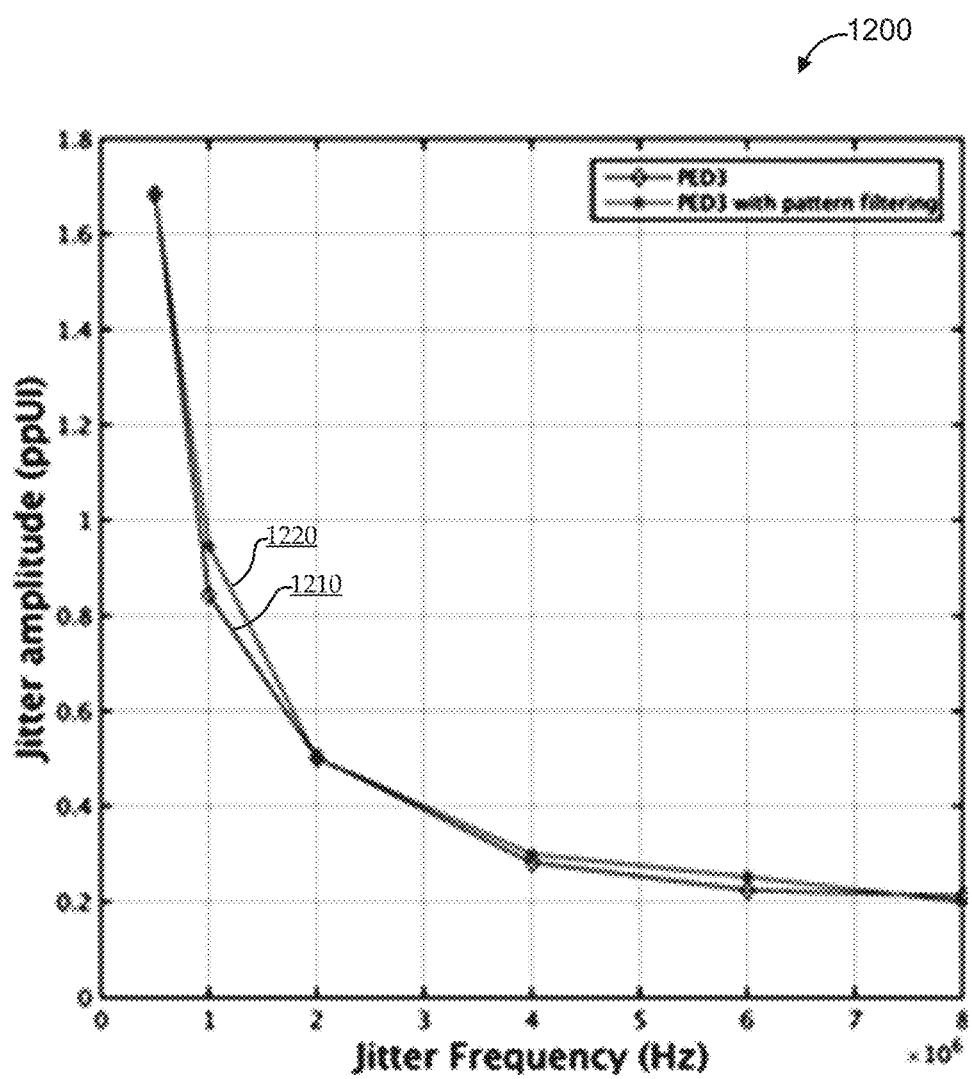
Figure 13:
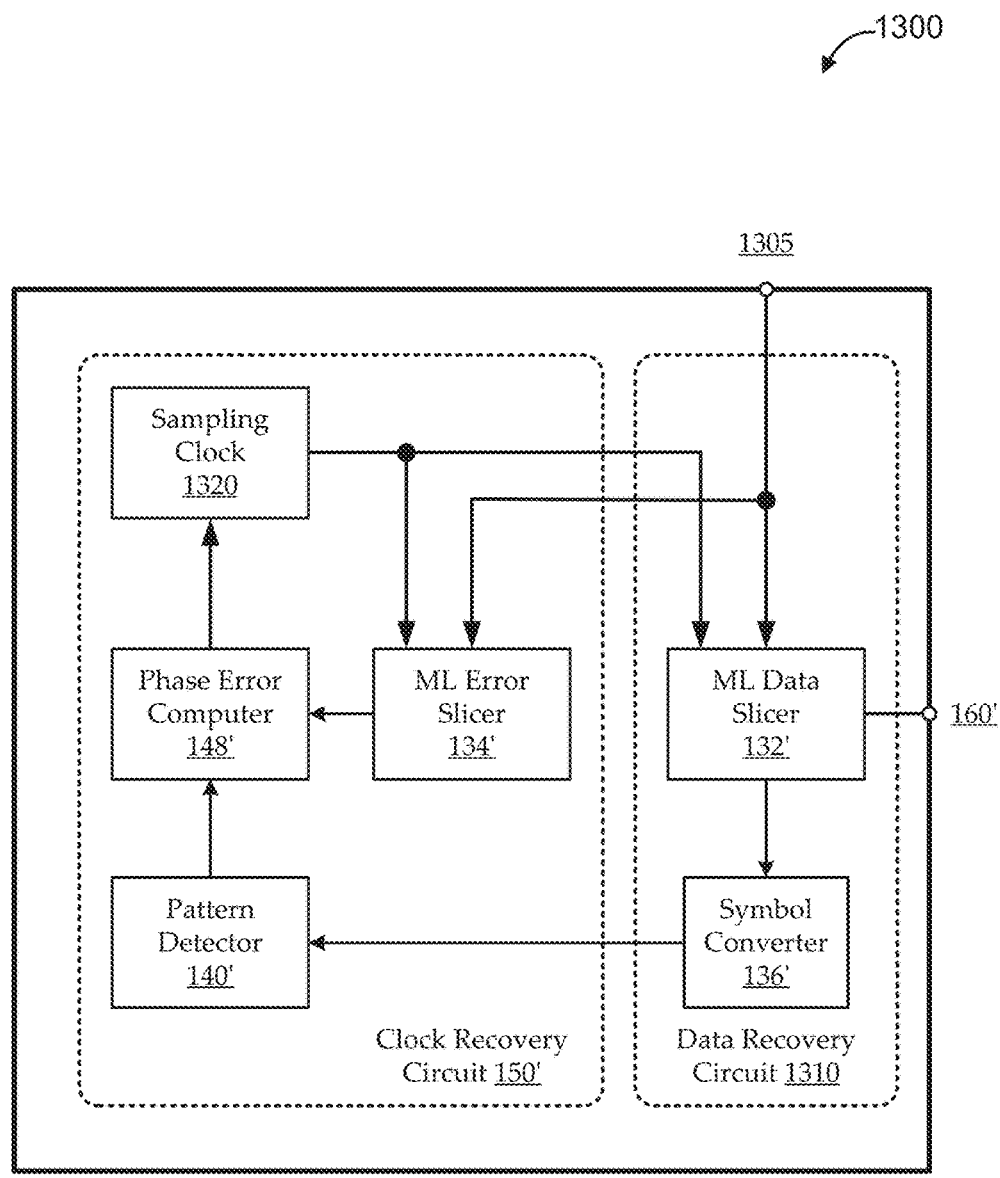
Figure 14:
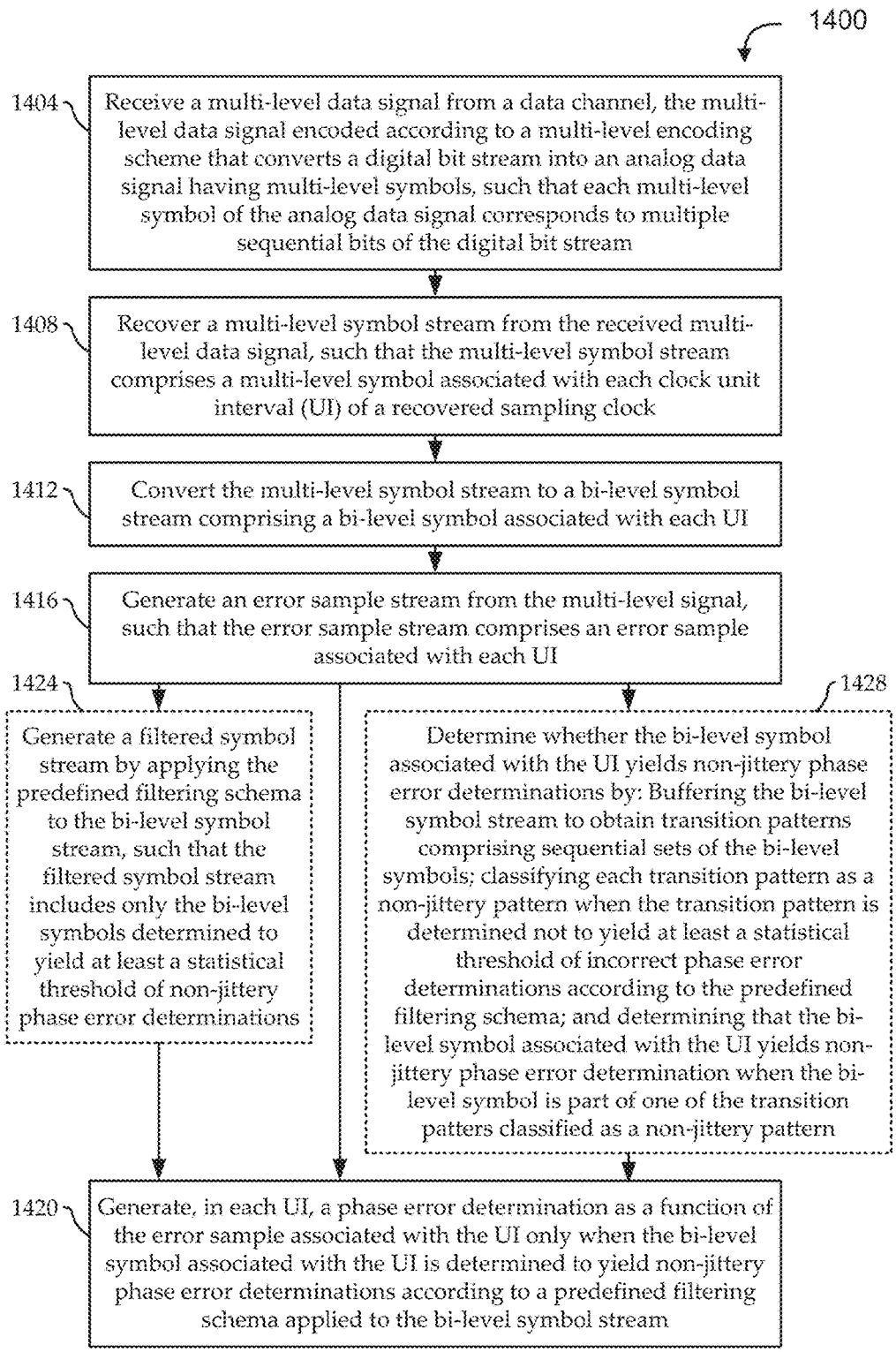

Turning first to FIG. 1, a block diagram is shown of an illustrative communications environment, according to various embodiments;

FIG. 2 shows an illustrative plot of the PED function as a function of the CDR locking point, $\beta(\tau)$;

FIG. 3 shows an illustrative first plot of a sign-based implementation of the PAM4 to NRZ conversion, and an illustrative second plot of a transition-based implementation of the PAM4 to NRZ conversion;

FIG. 4 shows an illustrative plot of a waveform representing the PED function of Equation 16 assuming b[k] is positive;

FIG. 5 shows an illustrative plot of a waveform representing the PED function of Equation 17, using a representative case with consecutive rising transitions (from d[k−2] to d[k−1] and from d[k−1] to d[k]);

FIG. 6 shows 16 plots, each having respective simulated data and error signals for each of 16 patterns that have (−1, −3) as their middle two symbols [COLOR];

FIG. 7 shows 16 plots, each having respective simulated distributions of PED slopes for each of the 16 patterns in FIG. 6 [COLOR];

FIG. 8 shows a plot of illustrative insertion loss for a channel model having −22 dB of gain at 10 GHz;

FIG. 9 shows a plot of a typical PAM4 eye diagram with a CDR locking point;

FIG. 10 shows a graph comparing JTOL simulations for PED1 and PED2;

FIG. 11 shows a graph comparing JTOL simulations for PED3 and PED4;

FIG. 12 shows a graph comparing JTOL simulations for PED3 before pattern filtering and PED3 after pattern filtering;

FIG. 13 shows a block diagram of an illustrative clock data recovery system, according to various embodiments; and FIG. 14 shows a flow diagram of a method for improving clock phase tracking performance in a clock data recovery (CDR) circuit, according to various embodiments.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Many electronics applications include communications channels that have transmitter and receiver components to move data through the electronics application. Some receiver circuits are serializer/deserializer (SERDES) receiver circuits that can, for example, convert parallel data from the communications channel into a serial data stream for processing, etc. Various functions of the SERDES rely on clocking to effectively sample and/or process the data being received from the channel, and the clock signal is often recovered from the data itself using a clock data recovery (CDR) circuit. One type of CDR circuit (sometimes referred to as a "bang-bang CDR" or an "oversampling CDR") attempts to extract clock timing information from both data and edge samples. Thus, the rate of the resulting clock signal is double the data rate. Another type of CDR circuit (sometimes referred to as a "Muller-Mueller CDR" or "MM CDR") uses data samples, but not edge samples, to recover clock timing information. Thus, the rate of the resulting clock signal is the data rate, and such CDR techniques are often referred to as "at-rate" CDR, or "baud-rate" CDR. At-rate CDR techniques provide various features. For example, avoiding double-rate clocking can appreciably reduce power consumption.

It is generally desirable for the receiver circuit to clock received data in the center of the "data eye," which can improve data recovery, reduce error, increase link margin, etc. Finding the optimal clocking location is typically a dynamic process that involves the CDR circuit and equalization circuitry (e.g., a decision feedback equalizer, linear equalizer, feed-forward equalizer, etc.). Typical at-rate CDR techniques extract timing information by analyzing a channel pulse response at one or more sample locations and determining whether current clocking appears to be early or late with respect to the pulse response. The clocking signal can then be shifted, as appropriate. However, a number of factors, such as inter-channel interference and clock jitter, can tend to frustrate accurate clock data recovery from the channel pulse response.

For example, jitter can be inherent in serializer/deserializer (SERDES) circuits, particularly on clock outputs (e.g., phase-locked loop, or PLL, outputs). The jitter can appreciably affect the link performance, particularly where the PLL is the primary clock source for both the transmitter and receiver circuits of the SERDES. Process variation among different clocking circuits, such as across different PLL circuits on a processor, can generate different amounts of jitter (e.g., different jitter amplitude and/or frequency). For example, process variations can lead to different characteristics of loop parameters, such as transmit and/or receiver filters, equalizers, etc. Jitter (e.g., from the PLL of the receiver and/or from the transmitter that transmitted the data signal received by the receiver) can impact the receiver's ability to accurately track the phase of the received data signal, which can reduce data bit recovery margin (e.g., impact the CDR's ability to lock onto the center of the data eye). With reduced data bit recovery margin, it can be more difficult for the CDR to reliably detect bit transitions.

Such difficulty can be exacerbated in data encoding schemes that have larger numbers (e.g., types) of bit transitions. For example, four-level pulse amplitude modulation (PAM4) is an encoding scheme that encodes two-bit data into a four-level symbol that gets transmitted every clock unit interval (UI). Such an encoding scheme can achieve twice the data rate as compared to that of two-level encoding schemes at the same bandwidth, such as non-return-to-zero (NRZ), or two-level pulse amplitude modulation (PAM2). Many receiver systems include clock data recovery (CDR) circuits that seek to provide tracking between a recovered data clock in the receiver and a data clock used to transmit the received data over a data channel (e.g., to find an optimal clock phase for sampling a received data signal to reliably recover the data bits encoded in the data signal). For CDR circuits designed to operate at baud-rate, many traditional applications have tended to use Mueller-Muller CDRs (MM-CDRs) with NRZ high-speed serializer/deserializer (SERDES) receivers, as such designs tend to be relatively simple to implement and relatively power efficient. However, when compared with the two-level signal of NRZ or PAM2 schemes, the four-level signal in PAM4 tends to have appreciably more complicated transition patterns, such that traditional MM-CDRs approaches may be less effective and/or more difficult to implement successfully. For example, while an NRZ scheme has only four possible transition patterns to decode (e.g., +1 to +1, +1 to −1, −1 to −1, or −1 to +1), a PAM4 scheme has 16 possible patterns to decode (e.g., +3 to +3, +3 to +1, +3 to −1, +3 to −3, +1 to +3, +1 to +1, +1 to −1, +1 to −3, −1 to +3, −1 to +1, −1 to −1, −1 to −3, −3 to +3, −3 to +1, −3 to −1, or −3 to −3).

Embodiments described herein include novel approaches for improving link performance and tracking capability of a baud-rate CDR using transition pattern detection. Some embodiments convert a received PAM4 signal to a pseudo-NRZ signal. CDR early/late voting can be derived from the converted (baud-rate) pseudo-NRZ signal and from error signals from the received PAM4 signal. For example, certain hardware implementations for NRZ MMCDR can be efficiently reused for implementing a PAM4 CDR. Various implementations are described in relation to categories of MM-CDR implementations and categories of phase error detector (PED) functions. For example, depending on how the PAM4-to-NRZ conversion is performed, MM-CDR implementations can be classified into a sign-based MM-CDR category (e.g., the converted NRZ contains the PAM4 sign information), and a transition-based MM-CDR category (e.g., the converted NRZ contains the PAM4 transition information). For each category of MM-CDR implementation, different PED functions can be used. As described herein, an analysis of two different PED functions employed in each category of MM-CDR implementation (i.e., effectively four PED functions), including an analytical derivation of the timing function and its expected locking point for each PED function, has demonstrated that all four PED functions can yield the same CDR locking point, and that the phase tracking capability of MMCDR can depend in all the PED function cases on the dominant residual pre-cursor and post-cursor inter-symbol-interference (ISI) terms. As supported by the analysis, the different MM-CDR implementations have different performance characteristics and tend to favor different PAM4 patterns. Adding pattern filtering into the CDR can improve CDR tracking capability by reducing CDR jitter and improving jitter tolerance as data bit transition patterns that generate low-quality jittery votes get filtered out.

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Turning first to FIG. 1, a block diagram is shown of an illustrative communications environment 100, according to various embodiments. The communications environment 100 includes a transmitter system 105 and a receiver system 110 in communication via a data channel 115. For example, the transmitter system 105 can include any suitable components, such as a driver, for communicating data over the data channel 115. The transmitter system 105 can be a transmitter portion (e.g., serializer portion) of a serializer/deserializer (SERDES) circuit. The data channel 115 can be any parallel or serial, wired or wireless, or other suitable communications channel for carrying the data. The receiver system 110 can be implemented in any suitable manner, for example as a receiver portion (e.g., deserializer portion) of a SERDES circuit. As described herein, it is assumed that data transmitted over the data channel 115 and received by the receiver system 110 is encoded according to a PAM4 scheme.

As illustrated, the receiver system 110 includes a signal receiver subsystem 120 and a CDR subsystem 130. While the receiver system 110 is illustrated as a simplified functional block diagram to avoid overcomplicating the description and figures, these simplifications should not be construed as limiting embodiments and implementations. The receiver system 110 can include fewer or additional components, and the various functional blocks can each be implemented as one or more discrete components, combined with other functional blocks into a single component, implemented in any suitable architecture or arrangement, etc. For example, the receiver system 110 includes any suitable components for receiving a data signal from the data channel 115 and reliably outputting data 160 as desired by other systems or components in communication with the receiver system 110. The signal receiver subsystem 120 can include amplifiers, filters, equalizers (e.g., a decision feedback equalizer, a linear equalizer, a feed-forward equalizer, etc.), parallel or serial interface components, and/or any other suitable components for converting the received data signal from the data channel 115 into a signal that can be used by other components of the receiver system 110.

Generally, the CDR subsystem 130 uses feedback to lock a recovered sampling clock to the center of the data eye to maximize data bit recovery margin. A data signal having PAM4-encoded data can be received by a data slicer 132 and an error slicer 134. The error slicer 134 uses the recovered sampling clock to generate error samples from the received data signal. The data slicer 132 uses the recovered sampling clock to generate data samples from the received data signal. The data samples can be output as a data output signal 160. In some implementations, the data output signal 160 is buffered by a deserializer and output as a deserialized data signal. The PAM4 data samples generated by the data slicer 132 can be converted into pseudo-NRZ data samples by the PAM4 to NRZ converter 136.

Embodiments of the CDR subsystem 130 include a clock recovery circuit 150, which can include the error slicer 134, a pattern detector 140, and a phase error computer 148 (e.g., a voting circuit). The pattern detector 140 can analyze each pseudo-NRZ sample to determine whether the sample corresponds to a recognized pattern. For example, the samples can be received by a buffer 142 and analyzed according to a look-up table 144, or the like. A pattern filter 146 can filter out (e.g., not pass through) patterns pre-determined to be highly jitter-sensitive and can pass-through patterns, otherwise. The data samples passed through by the pattern detector 140 and the error samples from the error slicer 134 can be used by a phase error computer 148 to generate votes (e.g., determinations as to whether the phase of the recovered clock appears to be early or late with respect to an ideal sampling point). The votes can be used (e.g., by a phase interpolator or other component of the receiver system 110) to advance or retard the phase of the recovered sampling clock. Though particular connections are shown with particular directionality (e.g., as indicated by arrows between components of the CDR subsystem 130), such are intended only to provide an illustrative implementation, and any other suitable implementation can be used herein.

The CDR subsystem 130 implements an at-rate CDR, such as a Mueller-Muller CDR (MM-CDR), or the like. MM-CDRs, and the like, are used in many high-speed serial link applications for a number of reasons. One reason is that MM-CDR implementations sample a received data signal once per clock unit interval (UI), such that they tend to be cost-effective hardware implementations as compared with CDR algorithms that use over sampling. Another reason is that, since MM-CDR is based on a baud-rate-sampled signal, the signal energy for frequency components beyond the Nyquist frequency tend to be negligible, which can be advantageous for communication systems with a limited bandwidth due to rapidly increasing data rates. In PAM4 signaling, two-bit data is encoded into a four-amplitude symbol, and one symbol gets transmitted in every UI. In this way, a double data rate can be achieved as compared to NRZ approaches at the same bandwidth. However, the resulting four-level signal in PAM4 approaches yields a larger number of (and, typically, more complicated) transition patterns. This can render bit recovery accuracy in PAM4 MM-CDR implementations more susceptible to reductions in link margin, for example, due to clock signal jitter.

For the sake of context, the CDR locking behavior for a conventional MM-CDR algorithm is derived. The signal y(t) at the input to the receiver system 110 can be written as Equation 1:

$$y(t) = \Sigma_n b[n] \cdot h(t - n \cdot T_b),$$

where h(t) denotes the pulse response of a high speed serial link channel (e.g., data channel 115), $T_b$ denotes the time interval of each UI, and b[n] denotes the stream of symbols (e.g. in NRZ, $b[n] \in \{-1, 1\}$; in PAM4 $b[n] \in \{-3, -1, 1, 3\}$). The derivation is agnostic to signaling scheme (e.g., NRZ or PAM4). For notation simplicity, and without losing accuracy, $T_b$ can be normalized to 1. With such a simplification, the signal at time $k \cdot T_b + \tau$ can be written as Equation 2:

$$y(k+\tau) = \Sigma_n b[n] \cdot h(k+\tau-n).$$

In the above equation, $\tau$ is a real number between 0 and 1, denoting the sampling point in the $k^{th}$ UI.

The phase error detector (PED) function for a MM-CDR implementation at sampling instant $k+\tau$ can be defined as Equation 3:

$$\gamma(k+\tau) = y(k-1+\tau)b[k] - y(k+\tau)b[k-1].$$

The PED function in MM-CDR can provide an analytical relationship between the phase error information and baud-rate sampling (e.g., implemented by the phase error computer 148 of FIG. 1). By expanding the signal y(k−1+τ) and y(k+τ) in the preceding equation into inter-symbol-interference (ISI) terms (h(t), t≠0), the first term in the PED function can be re-written as Equation 4:

$$y(k-1+\tau)b[k]=b[k]\Sigma_n b[n]\cdot h(k-1+\tau-n).$$

Similarly, the second term in the PED function can be re-written as Equation 5:

$$y(k+\tau)b[k-1]=b[k-1]\Sigma_n b[n]\cdot h(k+\tau-n).$$

Substituting the re-written terms, an expanded PED function can be written as Equation 6:

$$\gamma(k+\tau)\Sigma_n b[k]\cdot b[n]\cdot h(k-1+\tau-n)-\Sigma_n b[k-1]\cdot b[n]\cdot h(k+\tau-n).$$

The expanded PED function (Equation 6) is only dependent on ISI terms in the pulse response and signal symbols in each UI. Because the derivation to this point is scheme-agnostic (it is the same, regardless of whether NRZ, PAM4, or any other modulation schemes are used), the convergence of MM-CDR is demonstrated to be determined by the static and dynamic properties of the PED function. The static property of PED function can reflect the average CDR locking point, while the dynamic property can reflect the CDR jitter and its tracking capability.

The static properties of the PED function can be analyzed by calculating the expectation of the expanded PED function shown above. Assuming that the symbol sequence b[n] follows identical independent distribution with a uniform probability (for NRZ, b[n] is equally probable of being 1 or −1; for PAM4, b[n] is equally probable of being 3, 1, −1, or −3), the correlation of the symbols has the following property, defined by Equation 7:

$$E\{b[l]\cdot b[m]\} = \begin{cases} \alpha & m = l \\ 0 & m \neq l \end{cases},$$

where E{Ω} denotes the expectation, and a is a constant depending on the modulation scheme. For NRZ, (b[n]∈{1, −1}), α=1; and for PAM4, (b[n]∈{3,1, −1, −3}), α=5. By taking the expectation of the expanded PED function (Equation 6), the expectation of the non-expanded PED function can be derived as Equation 8:

$$E\{\gamma(k+\tau)\}=\alpha\cdot(h(\tau-1)-h(\tau+1)).$$

This derived expectation of the PED function reflects the static property of the PED function. MM-CDR algorithms, on average, evaluate the difference between h(τ−1) and h(τ+1), and the expected locking point τ of MMCDR algorithm will satisfy h(τ−1)=h(τ+1). The expectation of the PED function is solely dependent on the shape of the overall pulse response in the serial link, including effects of the transmitter system 105 (e.g., the transmitter finite impulse response filter), the channel 115, and the receiver system 110. To a first-order approximation, the sign of the PED function can be used as an indicator to update the CDR locking point. If γ(k+τ) is negative, the CDR locks too early. If γ(k+τ) is positive, the CDR locks too late. Following the above algorithms, the average CDR locking point in MM-CDR will satisfy the derived expectation equation stated above. The average CDR locking point can reflect the static behavior of the PED function. In contrast, the dynamic property of the PED function is not solely determined by the pulse response and the CDR locking position. Rather, the dynamic property of the PED function is dependent on the actual data patterns (b[i] in the expanded PED function stated above). For different transition patterns in the data signal, the PED function can behave differently.

FIG. 2 shows an illustrative plot 200 of the PED function as a function of the CDR locking point, γ(τ). Once the data pattern and the pulse response are fixed, the PED function can be treated as a pure function of the CDR locking point. Following the previous discussion, the average CDR locking point $\tau_0$ will make $\gamma(\tau_0) \approx 0$. Similarly, the value of γ(τ) can reveal the phase error. A positive γ(τ) indicates that the CDR locking point is too late, and a negative γ(τ) indicates that the CDR locking point is too early. Different data patterns may result in different PED functions. A good (i.e., non-jittery) PED function can tend to follow a curve similar to curve 220, which has a positive slope around $\tau_0$. With a positive slope around $\tau_0$, if the CDR locks too late ($\tau > \tau_0$), the PED function will be positive and correct phase error information can be reflected from the PED function. If the current locking point is too early ($\tau < \tau_0$), the PED function correctly feeds back tracking information indicating such early CDR locking. A poor (i.e., jittery) PED function can tend to follow a curve similar to curve 210, which has a negative slope around $\tau_0$. With a negative slope around $\tau_0$, the PED function will provide false phase information so it will generate jittery moves for CDR locking point (e.g., the feedback tracking information may indicate late CDR tracking when the CDR tracking point is, in fact, too early; or vise versa). Typically, the tracking capability of the CDR will be impacted by larger numbers of good CDR votes and moves seeking to correct for the jittery (potentially false) tracking information.

Returning to FIG. 1, the transitions of data patterns in PAM4 are more complicated than that in NRZ, because there are more levels of amplitudes in PAM4 symbol. In MM-CDR for PAM4, the dynamic property of the PED function can be more complicated than when using NRZ and can have more impacts on CDR performance. As illustrated, before being processed by the MMCDR logic, the PAM4 signal gets converted to pseudo-NRZ signal in some way. For example, PAM4 transitions sampled by the data slicer 132 can be converted to pseudo-NRZ transitions by the PAM4 to NRZ converter 136. The NRZ signal is referred to as "pseudo" because it is derived from, and has some correlation with, the PAM4 data, and is not purely random. After the PAM4-to-NRZ conversion is complete, the clock recovery circuit 150 (e.g. MM-CDR logic) can recover the timing information from the pseudo-NRZ data and generate timing information (e.g., early or late votes generated by the phase error computer 148) for the sampling clock. Some implementations reuse certain NRZ MM-CDR hardware to implement the PAM4 CDR.

Different implementations of the PAM4 to NRZ converter 136 can convert the PAM4 transitions to pseudo-NRZ transitions according to different approaches. According to one approach, the pseudo-NRZ data can be generated by directly taking the sign of the PAM4 data. An illustrative truth table for such an approach is as follows:

| d[k]    | b[k] |
|---------|------|
| 3 (11)  | 1    |
| 1 (10)  | 1    |
| −1 (01) | −1   |
| −3 (00) | −1   |

To distinguish the notations for PAM4 and NRZ data, "d[k]" (d[k]∈{−3, −1,1,3}) is used to denote PAM4 symbols and "b[k]" (b[k]∈{−1,1}) is used to denote NRZ symbols herein. Analytically, the conversion shown in the truth table can be written as Equation 9:

$$b[k]=\text{sign}(d[k]).$$

According to such an approach, the pseudo-NRZ data is only dependent on the current PAM4 symbol (the most significant bit of the PAM4 data).

According to another approach, the PAM4-to-NRZ conversion is performed based on PAM4 transitions. An illustrative truth table for such an approach is as follows:

| d[k − 1] | d[k] | b[k] |
|---|---|---|
| 3 | 3 | 0 |
| 3 | 1 | −1 |
| 3 | −1 | −1 |
| 3 | −3 | −1 |
| 1 | 3 | 1 |
| 1 | 1 | 0 |
| 1 | −1 | −1 |
| 1 | −3 | −1 |
| −1 | 3 | 1 |
| −1 | 1 | 1 |
| −1 | −1 | 0 |
| −1 | −3 | −1 |
| −3 | 3 | 1 |
| −3 | 1 | 1 |
| −3 | −1 | 1 |
| −3 | −3 | 0 |

As shown in the truth table, the pseudo-NRZ data is decided by the direction of transition between the previous and the current PAM4 symbol. If the transition direction from previous symbol to the current symbol is up (from the lower amplitude to the higher amplitude), the pseudo-NRZ data is positive; if the transition direction from previous symbol to the current symbol is down (from the higher amplitude to the lower amplitude), the pseudo-NRZ data is negative; and if the previous symbol and the current symbol are identical, b[k] is assigned the value of zero that indicates no transition. The transition-based PAM4-to-NRZ conversion can also be described using the following equation, Equation 10:

$$b[k]=\text{sign}(d[k-1]-d[k])$$

FIG. 3 shows an illustrative first plot 300a of a sign-based implementation of the PAM4 to NRZ conversion, and an illustrative second plot 300b of a transition-based implementation of the PAM4 to NRZ conversion. In the sign-based conversion approach, the sign information of PAM4 signal is maintained in the converted NRZ signal. In the transition-based conversion method, the transition information of PAM4 signal is contained in the pseudo-NRZ data. Due to their difference in nature, different PED functions can be used for different pseudo-NRZ signals.

Returning again to FIG. 1, in addition to extracting symbol information (e.g., using the data slicer 132 and the PAM4 to NRZ converter 136), the CDR subsystem 130 can extract timing information. For example, to extract timing information from the pseudo-NRZ data that contains the sign of PAM4 symbols, the PED function stated above (Equation 3) can be directly applied in some implementations. In other implementations (e.g., to reduce the cost in hardware implementation), Equation 3 can be converted to the following modified PED function as Equation 11:

$$\gamma(k+\tau)=e(k-1+\tau)b[k]-e(k+\tau)b[k-1].$$

In this modified PED function, e(t) represents the error signal of the PAM4 stream and b[k] represents the pseudo-NRZ data. The error signal e(t) is positive or negative, depending on the difference between the equalized signal and expected signal. If the equalized signal is larger than the expected signal, the error signal is positive. If the equalized signal is smaller than the expected signal, the error signal is negative. Analytically, the error signal can be expanded to residual ISI terms, as Equation 12:

$$e(k+\tau)=\left(\Sigma_n d[n]\cdot\hat{h}(k+\tau-n)\right).$$

The term ĥ(k) represents the residual ISIs after equalization (e.g., using a finite impulse response filter, a continuous time linear equalizer, a decision feedback equalizer, etc.), and d[n] denotes the PAM4 symbol. Substituting Equation 9 into Equation 11 and taking its expectation yields Equation 13:

$$E\{\gamma(\tau)\}=\hat{h}(\tau-1)-\hat{h}(\tau+1).$$

Therefore, the modified PED function in Equation 10 will lead to the same average CDR locking point as in Equation 3.

In some implementations (e.g., to further reduce hardware cost), the sign of the error signal, instead of the actual error signal, can be used in Equation 11. In such implementations, the PED function can be simplified as Equation 14:

$$\gamma(k+\tau)=e[k-1]b[k]-e[k]b[k-1].$$

By shifting the second term in Equation 14 by 1 UI, a different PED function can be written as Equation 15:

$$\gamma(k+\tau)=e[k-1](b[k]-b[k-2]).$$

Equations 14 and 15 lead to the same average locking point, but they differ in their dynamic properties, which may result in different tracking behaviors.

For implementations using transition-based PAM4 CDR, the pseudo-NRZ data contains the direction of PAM4 transitions. As such, different PED functions can be used. One such PED function is described by Equation 16:

$$\gamma(k)=b[k](e[k-1]+e[k]),$$

where b[k] denotes the pseudo-NRZ data with the information of PAM4 transition (d[k−1] to d[k]), and e[k] is the error signal of the PAM4 signal. The intuition of the PED function in Equation 16 can be illustrated, as shown in FIG. 4.

FIG. 4 shows an illustrative plot 400 of a waveform 410 representing the PED function of Equation 16 assuming b[k] is positive. Vertical dashed lines illustrate ideal sampling points for each of two UIs, and horizontal dashed lines illustrate an ideal reference voltage for each UI. The error signal in each UI can be derived by comparing the actual sampled voltage with the target reference voltage ($H_{ref}[k]$). If CDR locks at the ideal location, the waveform 410 will be sampled substantially at the ideal sampling point, such that the sampled voltage will substantially match the ideal reference voltage. As such, both e[k−1] and e[k] should be zero, and Equation 16 will not detect any phase error. If the CDR locks early (indicated by the dashed arrows labeled "early"), Equation 16 will report a negative value; and if the CDR locks late (indicated by the dashed arrows labeled "late"), Equation 16 will report a positive value. The sensitivity of the PED function can be determined by the slope of the error signal e[k−1] and e[k]. FIG. 4 shows only one case with a rising edge in PAM4. Other cases are shown in the following table:

| b[k] | PAM4 transition | e[k − 1] + e[k] | PED output |
|---|---|---|---|
| 1 | Up | 2 | Positive (late) |
| 1 | Up | −2 | Negative (early) |
| 1 | Up | 0 | Zero (no votes) |
| −1 | Down | 2 | Negative (early) |
| −1 | Down | −2 | Positive (late) |
| −1 | Down | 0 | Zero (no votes) |
| 0 | No transition | x | Zero (no votes) |

When there is no PAM4 transition, the PED function should be zero, and no early or late votes should be counted. Whenever there is a PAM4 transition, a positive PED output indicates a late locking point, and a negative PED output indicates an early locking point, and the phase of the sampling clock can be adjusted, accordingly. Alternatively, a different PED function can be modified from Equation 16 by shifting the second term by one UI to yield Equation 17:

$$\gamma(k)=e[k-1](b[k-1]+b[k]).$$

The intuition of the PED function in Equation 17 can be illustrated, as shown in FIG. 5.

FIG. 5 shows an illustrative plot 500 of a waveform 410 representing the PED function of Equation 17, using a representative case with consecutive rising transitions (from d[k−2] to d[k−1] and from d[k−1] to d[k]). Vertical dashed lines illustrate ideal sampling points for each of three UIs, and a horizontal dashed line illustrates an ideal reference voltage for one of the UIs. In the illustrated case, locking early will result in a negative error signal, e[k−1]<0, and locking late will result in a positive error signal, e[k−1]>0. The sensitivity of the PED function is determined by the slope of the waveform. Compared to Equation 16, Equation 17 only needs one error signal for phase detection. It can be mathematically proven that the PED functions in Equations 16 and 17 have the same expected locking point, which is identical to the one derived for Equation 13. However, their dynamic properties are different, as described below.

The above description includes two illustrative PED functions for each of two categories of PAM4 CDR (sign-based and transition-based), resulting effectively in four PED functions, as follows:

| Name | Category | NRZ b[k] | PED function |
|---|---|---|---|
| PED1 | Sign-based | sign(d[k]) | Equation 14 |
| PED2 | Sign-based | sign(d[k]) | Equation 15 |
| PED3 | Transition-based | sign(d[k − 1] − d[k]) | Equation 16 |
| PED4 | Transition-based | sign(d[k − 1] − d[k]) | Equation 17 |

All the PEDs listed above have the same expected locking point that is dependent on the shape of the channel pulse response, but each of those PEDs can demonstrate different behaviors under different PAM4 patterns and transitions.

Referring again back to FIG. 1, embodiments of the CDR subsystem 130 include a pattern detector 140 that can buffer the converted pseudo-NRZ signal in a buffer 142 and compare the buffered data against a lookup table (LUT) 144 to determine whether a particular buffered signal corresponds to a pattern previously identified as "good" or "bad" for the particular CDR implementation (i.e., a bad pattern can be one identified as too jittery to yield reliable error information). The LUT 144 can be generated in various ways according to different implementations. Some implementations are predictive (e.g., based on certain assumptions). Such implementations can use characteristics of the CDR implementation (e.g., of the implemented PED function) to categorize transitions as good or bad. For example, whenever the PAM4 data signal transitions up then down, or down then up (e.g., for a pattern, such as −3, −1, −3), there may be a zero slope in the error signal (the output of the error slicer 134) at that transition. It may be known that a particular PED function tends to be more sensitive to jitter with such transitions, and all patterns containing such a transition may be categorized as bad patterns in the LUT 144. Other implementations use simulations to analyze each of some or all patterns in context of the selected CDR implementation to determine whether the pattern appears to be sensitive to jitter. Patterns exhibiting a certain amount of sensitivity in the simulation can be categorized as bad patterns in the LUT 144. For example, the extracted PAM4 waveform can be divided into 256 groups, based on types of four consecutive transitions, and the simulation can collect approximately 4000 samples for each group. The slopes of PEDs in each group can be calculated from all samples collected, and the distribution of the slopes of PEDs can be reported. Variations among the slopes can be primarily an artifact of residual ISIs, and it can typically approximately follow a normal distribution. Still other implementations can use direct measurement. For example, in environments where the jitter sensitivity can be directly measured (e.g., in a laboratory test environment), each pattern can be fed into an implemented (e.g., fabricated) CDR, and the jitter sensitivity can be directly measured by a test probe, or the like. Again, patterns exhibiting a certain amount of sensitivity in the simulation can be categorized as bad patterns in the LUT 144.

For the sake of demonstration, waveforms can be extracted from a PAM4 serial link simulator, with a length of $10^6$ symbols after the link training. Four consecutive symbols are considered (d[k−2], d[k−1], d[k], d[k+1]) in context of each of the four PEDs described above, and the voting quality of each PEDs can be analyzed. With four symbols, each having four possible transitions, there can be 256 different potential patterns. For the sake of simplifying the description, a group of 16 of the symbols can be extracted from the full set, where the 16 symbols all have the same middle two symbols (d[k−1], d[k]) (i.e., this can yield 16 patterns with different combinations of d[k−2] and d[k+1]).

Some embodiments analyze the voting quality of a PED function at certain types of transitions by looking at the slope of the PED function, which is largely determined by the quality of the error signals. If the slope of the PED function under certain transitions is positive, they can be labeled as good votes because the sign of the PED output will be consistent with the error information. However, if the slope of the PED function under certain transitions are zero or negative, they can be labeled as jittery votes because negative slope will induce false phase detection, where incorrect votes may be generated. As described above, accuracy of CDR timing extraction can be improved when the phase error computer 148 receives a larger number of good transitions, while avoiding jittery votes from the unfavorable transitions.

FIG. 6 shows 16 plots, each having respective simulated data and error signals for each of 16 patterns that have (−1, −3) as their middle two symbols. In each plot, the red curve shows the data signal, and the blue curve shows the error signal. The markers denote the sampling phase in each UI. In each plot, the waveforms around the middle two symbols are different, depending on the leading and trailing symbols (d[k−2] and d[k+1]), even though the middle two symbols are the same. The difference in waveforms results in different voting characteristics for different PEDs.

FIG. 7 shows 16 plots, each having respective simulated distributions of PED slopes for each of the 16 patterns in FIG. 6. In each plot, the distributions of the four PEDs described above are plotted together. If a certain PED will generate no vote for a particular pattern, the PED is labeled with 'X' in the legend for that plot. The voting quality of different PED functions can be seen by comparing the distribution in each plot. For example, for transition [−1 −1 −3 3], PED1 shows the best voting quality (statistically, the most likely to have a positive slope), and PED3 shows the worst voting quality (statistically, the most likely to have a negative slope). For the same transition, PED2 does not generate any votes, because Equation 15 will be zero for that particular pattern.

Focusing on the sign-based CDR approaches, the relevant PED functions described above are PED1 and PED2 (following the naming convention the table above). The mean and the standard deviation of PED slopes can be extracted for each PAM4 transition. The slope mean can indicate an average sensitivity of the PEDs, and the standard deviation can indicate a width of the distribution. Some implementations classify a PED function as "good" when it shows a positive mean slope and a narrow distribution. Accordingly, slope mean and standard deviation can be used as a figure of merit (FOM) in characterizing the quality of PAM4 patterns for CDR voting. For each of the 16 transitions discussed above with reference to FIGS. 6 and 7, the mean and standard variation of PED1 and PED2 can be shown, as follows:

| Index | d[k−2] | d[k−1] | d[k] | d[k+1] | PED1 Slope Mean μ | Std σ | PED2 Slope Mean μ | Std σ |
|---|---|---|---|---|---|---|---|---|
| 1 | −3 | −1 | −3 | −3 | −2.83 | 0.71 | 0 | 0 |
| 2 | −3 | −1 | −3 | −1 | −0.31 | 0.72 | 0 | 0 |
| 3 | −3 | −1 | −3 | 1 | 2.15 | 0.77 | 0 | 0 |
| 4 | −3 | −1 | −3 | 3 | 4.65 | 0.8 | 0 | 0 |
| 5 | −1 | −1 | −3 | −3 | −0.72 | 0.7 | 0 | 0 |
| 6 | −1 | −1 | −3 | −1 | 1.8 | 0.7 | 0 | 0 |
| 7 | −1 | −1 | −3 | 1 | 4.26 | 0.73 | 0 | 0 |
| 8 | −1 | −1 | −3 | 3 | 6.8 | 0.76 | 0 | 0 |
| 9 | 1 | −1 | −3 | −3 | 1.4 | 0.69 | 6.75 | 0.65 |
| 10 | 1 | −1 | −3 | −1 | 3.91 | 0.7 | 7.57 | 0.65 |
| 11 | 1 | −1 | −3 | 1 | 6.4 | 0.7 | 8.44 | 0.64 |
| 12 | 1 | −1 | −3 | 3 | 8.9 | 0.73 | 9.28 | 0.63 |
| 13 | 3 | −1 | −3 | −3 | 3.52 | 0.69 | 10.52 | 0.7 |
| 14 | 3 | −1 | −3 | −1 | 6.04 | 0.69 | 11.36 | 0.69 |
| 15 | 3 | −1 | −3 | 1 | 8.53 | 0.7 | 12.23 | 0.7 |
| 16 | 3 | −1 | −3 | 3 | 11 | 0.71 | 13.09 | 0.68 |

In the table above, if the mean and standard deviation are both zero, the PED function does not generate vote for that particular pattern. For example, for the 8th listed pattern, PED1 has non-zero slope that will generate votes, while PED2 has zero slope that will not generate votes. The voting quality of each pattern can be reflected by the slope mean and standard deviation. For example, PED1 has a negative slope for the first listed pattern, which means that jittery votes are likely to be collected for that pattern; and PED2 will not generate votes for that same pattern. Based on the mean ($\mu$) and the standard deviation ($\sigma$) of PED slopes, a particular FOM can be defined to yield a desired statistical threshold. For example $\mu-3\sigma$ can be defined as the FOM, such that a PED with a positive FOM has a positive slope with a probability of larger than 99%.

Based on the FOM, three types of PAM4 patterns can be classified: good patterns, jittery patterns, and non-voting patterns. The simulated number of each type of pattern is summarized for PED1 and PED2 as follows:

| PED name | Good patterns $\mu - 3\sigma > 0$ | Jittery patterns $\mu - 3\sigma < 0$ | Non-voting patterns | Total |
|---|---|---|---|---|
| PED1 | 184 | 72 | 0 | 256 |
| PED2 | 128 | 0 | 128 | 256 |

According to the table above, PED1 will generate votes for all 256 patterns, while PED2 only generates votes for half of the patterns. As such, the voting density of PED1 will be higher than PED2, which can generally result in better tracking capability. At the same time, there are 72 jittery patterns for PED1, and 0 jittery patterns for PED2. The jittery patterns will likely result in some false error detection in PED1, which may increase the CDR jitter and affect the CDR tracking. Compared to PED2, PED1 has 56 more good patterns for voting and 72 more jittery patterns. Accordingly, the choice of PED can involve certain trade-offs, as discussed further below.

The preceding discussion focuses on sign-based approaches, including an analysis of the related PED1 and PED2 functions. The following discussion focuses on transition-based approaches, including an analysis of the related PED3 and PED4 functions listed above. A similar approach can be used for pattern analysis. The PED slope mean and standard deviation for PED3 and PED4 can be simulated with 16 representative patterns (each following a pattern of [X −1 1 Y]) to achieve the following results:

| Index | d[k−2] | d[k−1] | d[k] | d[k+1] | PED3 Slope Mean μ | Std σ | PED4 Slope Mean μ | Std σ |
|---|---|---|---|---|---|---|---|---|
| 1 | −3 | −1 | 1 | −3 | 2.03 | 0.49 | 9.1 | 0.6 |
| 2 | −3 | −1 | 1 | −1 | 3.68 | 0.47 | 8.22 | 0.61 |
| 3 | −3 | −1 | 1 | 1 | 5.34 | 0.47 | 7.39 | 0.62 |
| 4 | −3 | −1 | 1 | 3 | 6.97 | 0.47 | 6.53 | 0.62 |
| 5 | −1 | −1 | 1 | −3 | 0.36 | 0.48 | 2.65 | 0.32 |
| 6 | −1 | −1 | 1 | −1 | 1.99 | 0.47 | 2.21 | 0.31 |
| 7 | −1 | −1 | 1 | 1 | 3.65 | 0.47 | 1.79 | 0.31 |
| 8 | −1 | −1 | 1 | 3 | 5.29 | 0.47 | 1.37 | 0.3 |
| 9 | 1 | −1 | 1 | −3 | −1.31 | 0.47 | 0 | 0 |
| 10 | 1 | −1 | 1 | −1 | 0.32 | 0.47 | 0 | 0 |
| 11 | 1 | −1 | 1 | 1 | 1.97 | 0.47 | 0 | 0 |
| 12 | 1 | −1 | 1 | 3 | 3.62 | 0.47 | 0 | 0 |
| 13 | 3 | −1 | 1 | −3 | −3 | 0.47 | 0 | 0 |
| 14 | 3 | −1 | 1 | −1 | −1.36 | 0.47 | 0 | 0 |
| 15 | 3 | −1 | 1 | 1 | 0.29 | 0.48 | 0 | 0 |
| 16 | 3 | −1 | 1 | 3 | 1.95 | 0.49 | 0 | 0 |

Based on the FOM and the three classifications for PAM4 patterns described above, the simulated number of each type of pattern is summarized for PED3 and PED4 as follows:

| PED name | Good patterns $\mu - 3\sigma > 0$ | Jittery patterns $\mu - 3\sigma < 0$ | Non-voting patterns | Total |
|---|---|---|---|---|
| PED3 | 142 | 50 | 64 | 256 |
| PED4 | 128 | 0 | 128 | 256 |

According to the table above, for these 16 patterns, PED3 has a higher voting density than PED4, but PED4 will not generate any jittery votes. Compared to PED4, PED3 has 14 more good voting patterns at the expense of 50 jittery patterns. Again, the choice of PED can involve certain trade-offs, as discussed further below.

A simulator can be used to analyze tracking performance of various PEDs (e.g., the four PED functions described above) based on jitter tolerance. The simulator can include a model PAM4 SERDES transceiver without implementation details. For example, simulated PAM4 signals can be generated with a modeled transmitter (e.g., corresponding to transmitter system 105 in FIG. 1) with a finite impulse response filter. The signals can be received via a modeled channel (e.g., corresponding to channel 115 in FIG. 1) by a receiver (e.g., corresponding to receiver system 110 in FIG. 1). The receiver can be modeled with a continuous time linear equalizer, a variable gain amplifier, and a summer for feedback from decision feedback equalization adaptation and CDR adaptation. As illustrated in FIG. 1, the CDR can be modeled to include slicers for error and data decision (e.g., corresponding to data slicer 132 and error slicer 134 in FIG. 1). FIG. 8 shows a plot 800 of illustrative insertion loss for a channel model having −22 dB of gain at 10 GHz. The model can include settings for such an insertion loss for the channel and for ISI terms, for example, as follows:

|         | IL @ 10 GHz | IL @ 20 GHz | h-1/h0 | h1/h0 |
|---------|-------------|-------------|--------|-------|
| Channel | −22 dB      | −40 dB      | 24%    | 67%   |

As described above, the various PED functions can all have similar CDR locking points with similar link performance without sinusoidal jitter (Sj) injection. FIG. 9 shows a plot 900 of a typical PAM4 eye diagram with a CDR locking point. The simulation can include jitter tolerance (JTOL) simulations run for each PED function in context of an identical channel and SERDES architecture. In the JTOL simulation, Sj is injected on the sampling clock. The amplitude of the Sj keeps increasing until a predefined bit error rate (e.g., $10^{-12}$) cannot be satisfied.

FIG. 10 shows a graph 1000 comparing JTOL simulations for PED1 and PED2 (e.g., for sign-based approaches). The JTOL simulation results for PED1 is illustrated as waveform 1010, and the JTOL simulation results for PED2 is illustrated as waveform 1020. The waveforms indicate the maximum peak-to-peak amplitude (ppUI) of sinusoidal jitter that can be tracked by the modeled CDR under different frequencies to meet the predetermined BER requirement of $10^{-12}$. As noted above, PED2 misses some patterns for voting, as compared to PED1, but there are more jittery voting patterns in PED1 than in PED2. Still, the illustrated JTOL performance of PED1 and PED2 are similar, which indicates that the impact of jittery votes is mitigated by more good votes in PED1.

FIG. 11 shows a graph 1100 comparing JTOL simulations for PED3 and PED4 (e.g., for transition-based approaches). The JTOL simulation results for PED3 is illustrated as waveform 1110, and the JTOL simulation results for PED4 is illustrated as waveform 1120. As noted above, PED3 has slightly higher voting density than PED4, but it has many more jittery voting patterns. For that reason, the comparison of their JTOL performance indicates, as expected, that the tracking capability of PED3 is slightly worse than that of PED4, mainly due to the jittery voting patterns in PED3. As described above, there are more good voting patterns in PED1 than in PED3, so PED3 will tend to be more prone to jittery votes. Accordingly, the JTOL difference between PED1 and PED2 shown in FIG. 10 is smaller than the difference between PED3 and PED4 shown in FIG. 11.

The graph 1100 of FIG. 11 indicates that the impact of jittery votes in PED3 is not completely countered by good voting patterns. Accordingly, PED3 can be used to demonstrate the impact of novel pattern filtering approaches described here, for example, as provided by the novel pattern detector 140 of FIG. 1. As described herein, the pattern detector 140 can be used to effectively filter out at least some of the voting patterns known to be jittery, thereby tending to improve CDR tracking. The patterns to be filtered (e.g., as stored in LUT 144) can be identified in any suitable manner, as described above. For example, jittery patterns can be identified categorically, by simulation, by direct measurement, etc. Using the pattern analysis simulation described above, the following 22 of the 256 patterns are found to have negative average slopes using PED3:

| Index | Pattern |
|-------|---------|
| 1 | 1, −1, 1, −3 |
| 2 | 3, −1, 1, −3 |
| 3 | 3, −1, 1, −1 |
| 4 | 3, −1, 3, −3 |
| 5 | 3, −1, −3, 1 |
| 6 | −3, −1, −3, 3 |
| 7 | −1, −1, −3, 3 |
| 8 | 3, −3, 1, −3 |
| 9 | 1, −3, −1, −3 |
| 10 | 3, −3, −1, −3 |
| 11 | 3, −3, −1, −1 |
| 12 | −1, 1, −1, 3 |
| 13 | −3, 1, −1, 3 |
| 14 | −3, 1, −1, 1 |
| 15 | −3, 1, −3, 3 |
| 16 | −3, 1, 3, −1 |
| 17 | 3, 1, 3, −3 |
| 18 | 1, 1, 3, −3 |
| 19 | −3, 3, −1, 3 |
| 20 | −1, 3, 1, 3 |
| 21 | −3, 3, 1, 3 |
| 22 | −3, 3, 1, 1 |

FIG. 12 shows a graph comparing JTOL simulations for PED3 before pattern filtering and PED3 after pattern filtering. The JTOL simulation results for PED3 without pattern filtering is illustrated as waveform 1210, and the JTOL simulation results for PED3 with pattern filtering is illustrated as waveform 1220. The 22 patterns listed above are all expected to cause the PED function to detect false phase error and to generate jittery votes. By filtering out those jittery votes, the tracking capability of PED3 can be improved. The filtering represents a trade-off between reducing overall CDR voting density (with data patterns filtered out) and increasing the likelihood of non-jittery votes (by ignoring data likely to result in jittery votes). Comparing the waveforms in FIG. 12 reveals that better jitter tolerance can be achieved by such pattern filtering.

FIG. 13 shows a block diagram of an illustrative clock data recovery system 1300, according to various embodiments. The clock data recovery system 1300 can be an implementation of the clock data recovery system 130 of FIG. 1, and similar reference numerals are used for similar components. As described above, embodiments of the clock data recovery system 1300 can be implemented as part of a receiver of a SERDES, or the like. For the sake of simplicity, the clock data recovery system 1300 is illustrated as having one input (a data channel input 1305) and one output (a recovered data output 160). Alternative implementations can include any suitable number and type of inputs and outputs. As illustrated, the clock data recovery system 1300 includes a multi-level data slicer 132', a symbol converter 136', a multi-level error slicer 134', a phase error computer 148', a pattern detector 140', and a sampling clock 1320.

The multi-level data slicer 132' can have a first data channel input that, when coupled with a data channel, includes a multi-level data signal (e.g., a PAM4 signal) received from the data channel, the multi-level data signal encoded according to a multi-level encoding scheme that converts a digital bit stream into an analog data signal having multi-level symbols (PAM4 symbols), such that each multi-level symbol of the analog data signal corresponds to multiple sequential bits of the digital bit stream. The multi-level data slicer 132' can also include a multi-level signal output comprising a multi-level symbol stream recovered from the received multi-level data signal, such that the multi-level symbol stream comprises a multi-level symbol (a PAM4 symbol) associated with each clock unit interval (UI) of a recovered sampling clock (output by the sampling clock 1320).

The symbol converter 136' can include a multi-level signal input coupled with the multi-level signal output. The symbol converter 136' can also include a bi-level signal output having a bi-level symbol stream (e.g., a pseudo-NRZ symbol stream) converted from the multi-level symbol stream to comprise a bi-level symbol associated with each UI. For example, the bi-level symbol stream can include pseudo-NRZ data symbols each converted to preserve sign data and/or transition data from a respective corresponding portion of the multi-level symbol stream.

The multi-level error slicer 134' can include a second data channel input that, when coupled with the data channel, includes the multi-level data signal received from the data channel. For example, the multi-level error slicer 134' and the multi-level data slicer 132' can be coupled to a same input 1305, as illustrated, or each can be coupled to a different input. The multi-level error slicer 134' can also include an error signal output having an error sample stream generated from the multi-level signal, such that the error sample stream has an error sample associated with each UI.

The phase error computer 148' can include a filtered data input having an indication, in each UI, of whether the bi-level symbol associated with the UI is determined to yield non-jittery phase error determinations according to a predefined filtering schema applied to the bi-level symbol stream. The phase error computer 148' can also include an error signal input coupled with the error signal output of the multi-level error slicer 134'. The phase error computer 148' can also include a phase error determination output having, in each UI, a phase error determination as a function of the error sample associated with the UI only when the indication is that the bi-level symbol associated with the UI is determined to yield non-jittery phase error determinations. For example, the phase error computer 148' can be implemented as a voting circuit. The phase error determinations can be computed according to any suitable phase error detection function, such as those described above. In some embodiments, the filtered data input includes a filtered symbol stream generated by applying the predefined filtering schema to the bi-level symbol stream, such that the filtered symbol stream includes only the bi-level symbols determined to yield at least a statistical threshold of non-jittery phase error determinations. As described above, some embodiment can implement the phase error computer 148' (e.g., and/or other components of the clock data recovery system 1300) as part of an at-rate CDR, such as a MM-CDR.

Some embodiments of the clock data recovery system 1300 include a pattern detector 140'. The pattern detector 140' can include a buffer coupled with the bi-level signal output (of the symbol converter 136') and a transition pattern output having sequential sets of the bi-level symbols obtained from the bi-level symbol stream. The pattern detector 140' can also include a classifier having a transition pattern input coupled with the transition pattern output of the buffer, and a filtered data output coupled with the filtered data input of the phase error computer 148'. The filtered data output can include the indication (i.e., the indication, in each UI, of whether the bi-level symbol associated with the UI is determined to yield non-jittery phase error determinations according to a predefined filtering schema applied to the bi-level symbol stream) and the indication can be generated by classifying each transition pattern as a non-jittery pattern when the transition pattern is determined not to yield at least a statistical threshold of incorrect phase error determinations according to the predefined filtering schema. Each bi-level symbol associated with a UI can be determined to yield non-jittery phase error determination when the bi-level symbol is part of one of the transition patterns classified as a non-jittery pattern. Some implementations of the pattern detector 140' include a lookup table that stores the predefined filtering schema as a plurality of transition pattern models. Each transition pattern model can be pre-classified as a jittery pattern or a non-jittery pattern (e.g., by using jitter tolerance simulations, and/or other techniques, such as those described above). The indication can be generated by classifying each transition pattern as a non-jittery pattern by comparing the transition pattern to the lookup table to determine whether the transition pattern corresponds to a pre-classified non-jittery pattern.

Some embodiments of the clock data recovery system 1300 include the sampling clock 1320 (or are coupled with the sampling clock 1320). The sampling clock 1320 can include a phase adjustment input coupled with the phase error determination output of the phase error computer 148', and a clock signal output that includes the recovered sampling clock. The phase of the recovered sampling clock can be advanced, retarded, or maintained according to the phase adjustment input. For example, the sampling clock 1320 can include, or be coupled with, a phase interpolator or other component that can adjust the clock phase according to the phase error determinations.

FIG. 14 shows a flow diagram of a method 1400 for improving clock phase tracking performance in a clock data recovery (CDR) circuit, according to various embodiments. In some embodiments, the method 1400 can be implemented using any of the systems described above, or any other suitable system. As described above, embodiments can operate in context of a baud-rate, or at-rate CDR, for example, as part of a SERDES circuit. Embodiments can begin at stage 1404 by receiving a multi-level data signal from a data channel, the multi-level data signal encoded according to a multi-level encoding scheme that converts a digital bit stream into an analog data signal having multi-level symbols, such that each multi-level symbol of the analog data signal corresponds to multiple sequential bits of the digital bit stream. For example, the multi-level encoding scheme is a four-level pulse amplitude modulation (PAM4) encoding scheme.

At stage 1408, embodiments can recover a multi-level symbol stream from the received multi-level data signal, such that the multi-level symbol stream includes a multi-level symbol (e.g., a PAM4 symbol) associated with each clock unit interval (UI) of a recovered sampling clock. In some implementation, the recovering at stage 1408 is by a data slicer. At stage 1412, embodiments can convert the multi-level symbol stream to a bi-level symbol stream including a bi-level symbol associated with each UI. In some implementations, the converting is such that the bi-level symbol stream includes pseudo-non-return-to-zero (pseudo-NRZ) data symbols that each preserves sign data of a respective corresponding portion of the multi-level symbol stream. In other implementations, the converting is such that the bi-level symbol stream includes pseudo-NRZ data symbols that each preserves transition data of a respective corresponding portion of the multi-level symbol stream.

At stage 1416, embodiments can generate an error sample stream from the multi-level signal, such that the error sample stream includes an error sample associated with each UI. For example, the error sample is generated by an error slicer. At stage 1420, embodiments can generate, in each UI, a phase error determination as a function of the error sample associated with the UI only when the bi-level symbol associated with the UI is determined to yield non-jittery phase error determinations according to a predefined filtering schema applied to the bi-level symbol stream. For example, each phase error determination can indicate whether to advance, retard, or maintain a phase of the recovered sampling clock. As used herein, a "no vote," or otherwise a lack of a determination, is different from a determination to maintain the current phase. As described above, in some cases, the result of a phase error determination can be used to keep the phase of the recovered sampling clock the same as it was in the preceding UI (e.g., the phase error computer determined that the clock phase is properly locked onto the center of the data eye). However, filtering out certain jittery patterns can result in no phase error determination (e.g., no vote) being made for that UI (e.g., the phase error computer can effectively be gated from making any determination for that UI). In other implementations, rather than being gated, or otherwise prevented from making a phase error determination in UIs where the pattern is determined to be jittery, the phase error computer can be forced to output a "no vote" indication. Such cases can still be considered herein as if no determination was made for that UI.

The pattern filtering and phase error determination of stage 1420 can be performed in various manners, according to different embodiments. In some embodiments, at stage 1424, a filtered symbol stream can be generated by applying the predefined filtering schema to the bi-level symbol stream, such that the filtered symbol stream includes only the bi-level symbols determined to yield at least a statistical threshold of non-jittery phase error determinations. In other embodiments, at stage 1428, the method can determine whether the bi-level symbol associated with the UI yields non-jittery phase error determinations. For example, the determining at stage 1428 can include: buffering the bi-level symbol stream to obtain transition patterns including sequential sets of the bi-level symbols; classifying each transition pattern as a non-jittery pattern when the transition pattern is determined not to yield at least a statistical threshold of incorrect phase error determinations according to the predefined filtering schema; and determining that the bi-level symbol associated with the UI yields non-jittery phase error determination when the bi-level symbol is part of one of the transition patterns classified as a non-jittery pattern. In some implementations, the predefined filtering schema includes multiple transition pattern models stored in a lookup table, each transition pattern model pre-classified as a jittery pattern or a non-jittery pattern, the classifying includes comparing the transition pattern to the lookup table to determine whether the transition pattern corresponds to a pre-classified non-jittery pattern. For example, as described above, each transition pattern model is pre-classified as a jittery pattern or a non-jittery pattern according to a jitter tolerance simulation applied to a circuit simulation model of the CDR circuit. In some implementations, the classifying includes: identifying, for each transition pattern, a corresponding one of the transition pattern models in the lookup table; classifying the transition pattern as a jittery pattern when the corresponding transition pattern model is predetermined to yield at least a statistical threshold of incorrect phase error determinations; and classifying the transition pattern as a non-jittery pattern when the corresponding transition pattern model is predetermined to yield at least a statistical threshold of correct phase error determinations.

The methods disclosed herein include one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A method for improving clock phase tracking performance in a clock data recovery circuit, the method comprising:
receiving a multi-level data signal from a data channel, the multi-level data signal encoded according to a multi-level encoding scheme that converts a digital bit stream into an analog data signal having multi-level symbols, such that each multi-level symbol of the analog data signal corresponds to multiple sequential bits of the digital bit stream;
recovering a multi-level symbol stream from the received multi-level data signal, such that the multi-level symbol stream comprises a multi-level symbol associated with each clock unit interval (UI) of a recovered sampling clock;
converting the multi-level symbol stream to a bi-level symbol stream comprising a bi-level symbol associated with each UI;
generating an error sample stream from the multi-level data signal, such that the error sample stream comprises an error sample associated with each UI;
generating, in each UI, a phase error determination as a function of the error sample associated with the UI only when the bi-level symbol associated with the UI is determined to yield non-jittery phase error determinations according to a predefined filtering schema applied to the bi-level symbol stream; and
generating a filtered symbol stream by applying the predefined filtering schema to the bi-level symbol stream, such that the filtered symbol stream includes only the bi-level symbols determined to yield at least a statistical threshold of non-jittery phase error determinations.

2. A method for improving clock phase tracking performance in a clock data recovery circuit, the method comprising:
receiving a multi-level data signal from a data channel, the multi-level data signal encoded according to a multi-level encoding scheme that converts a digital bit stream into an analog data signal having multi-level symbols, such that each multi-level symbol of the analog data signal corresponds to multiple sequential bits of the digital bit stream;
recovering a multi-level symbol stream from the received multi-level data signal, such that the multi-level symbol stream comprises a multi-level symbol associated with each clock unit interval (UI) of a recovered sampling clock;
converting the multi-level symbol stream to a bi-level symbol stream comprising a bi-level symbol associated with each UI;
generating an error sample stream from the multi-level data signal, such that the error sample stream comprises an error sample associated with each UI;
generating, in each UI, a phase error determination as a function of the error sample associated with the UI only when the bi-level symbol associated with the UI is determined to yield non-jittery phase error determinations according to a predefined filtering schema applied to the bi-level symbol stream; and
determining whether the bi-level symbol associated with the UI yields non-jittery phase error determinations, the determining comprising:
buffering the bi-level symbol stream to obtain transition patterns comprising sequential sets of the bi-level symbols;
classifying each transition pattern as a non-jittery pattern when the transition pattern is determined not to yield at least a statistical threshold of incorrect phase error determinations according to the predefined filtering schema; and
determining that the bi-level symbol associated with the UI yields non-jittery phase error determination when the bi-level symbol is part of one of the transition patterns classified as a non-jittery pattern.

3. The method of claim 2, wherein:
the predefined filtering schema comprises a plurality of transition pattern models stored in a lookup table, each transition pattern model pre-classified as a jittery pattern or a non-jittery pattern; and
the classifying comprises comparing the transition pattern to the lookup table to determine whether the transition pattern corresponds to a pre-classified non-jittery pattern.

4. The method of claim 3, wherein:
each transition pattern model is pre-classified as a jittery pattern or a non-jittery pattern according to a jitter tolerance simulation applied to a circuit simulation model of the clock data recovery circuit.

5. The method of claim 2, wherein the classifying comprises:
identifying, for each transition pattern, a corresponding one of the transition pattern models in the lookup table;
classifying the transition pattern as a jittery pattern when the corresponding transition pattern model is predetermined to yield at least a statistical threshold of incorrect phase error determinations; and
classifying the transition pattern as a non-jittery pattern when the corresponding transition pattern model is predetermined to yield at least a statistical threshold of correct phase error determinations.

6. The method of claim 1, further comprising:
advancing, retarding, or maintaining a phase of the recovered sampling clock in response to, and according to, the phase error determination.

7. The method of claim 1, wherein the multi-level encoding scheme is a four-level pulse amplitude modulation (PAM4) encoding scheme.

8. The method of claim 1, wherein the converting is such that the bi-level symbol stream comprises pseudo-non-return-to-zero (pseudo-NRZ) data symbols that each preserves sign data of a respective corresponding portion of the multi-level symbol stream.

9. The method of claim 1, wherein the converting is such that the bi-level symbol stream comprises pseudo-NRZ data symbols that each preserves transition data of a respective corresponding portion of the multi-level symbol stream.

10. The method of claim 2, further comprising:
advancing, retarding, or maintaining a phase of the recovered sampling clock in response to, and according to, the phase error determination, and
wherein the multi-level encoding scheme is a four-level pulse amplitude modulation (PAM4) encoding scheme.

11. The method of claim 2, wherein the converting is such that the bi-level symbol stream comprises pseudo-non-return-to-zero (pseudo-NRZ) data symbols that each preserves sign data of a respective corresponding portion of the multi-level symbol stream.

12. The method of claim 2, wherein the converting is such that the bi-level symbol stream comprises pseudo-NRZ data symbols that each preserves transition data of a respective corresponding portion of the multi-level symbol stream.

13. A clock data recovery system comprising:
   a multi-level data slicer comprising:
      a first data channel input that, when coupled with a data channel, comprises a multi-level data signal received from the data channel, the multi-level data signal encoded according to a multi-level encoding scheme that converts a digital bit stream into an analog data signal having multi-level symbols, such that each multi-level symbol of the analog data signal corresponds to multiple sequential bits of the digital bit stream; and
      a multi-level signal output comprising a multi-level symbol stream recovered from the received multi-level data signal, such that the multi-level symbol stream comprises a multi-level symbol associated with each clock unit interval (UI) of a recovered sampling clock;
   a symbol converter comprising:
      a multi-level signal input coupled with the multi-level signal output; and
      a bi-level signal output comprising a bi-level symbol stream converted from the multi-level symbol stream to comprise a bi-level symbol associated with each UI;
   a multi-level error slicer comprising:
      a second data channel input that, when coupled with the data channel, comprises the multi-level data signal received from the data channel; and
      an error signal output comprising an error sample stream generated from the multi-level signal, such that the error sample stream comprises an error sample associated with each UI; and
   a phase error computer comprising:
      a filtered data input comprising an indication, in each UI, of whether the bi-level symbol associated with the UI is determined to yield non-jittery phase error determinations according to a predefined filtering schema applied to the bi-level symbol stream;
      an error signal input coupled with the error signal output; and
      a phase error determination output comprising, in each UI, a phase error determination as a function of the error sample associated with the UI only when the indication is that the bi-level symbol associated with the UI is determined to yield non-jittery phase error determinations,
   wherein the bi-level symbol stream comprises pseudo-non-return-to-zero (pseudo-NRZ) data symbols each converted to preserve sign data from a respective corresponding portion of the multi-level symbol stream or the bi-level symbol stream comprises pseudo-NRZ data symbols each converted to preserve transition data from a respective corresponding portion of the multi-level symbol stream.

14. The system of claim 13, wherein the filtered data input comprises a filtered symbol stream generated by applying the predefined filtering schema to the bi-level symbol stream, such that the filtered symbol stream includes only the bi-level symbols determined to yield at least a statistical threshold of non-jittery phase error determinations.

15. The system of claim 13, further comprising:
   a pattern detector comprising:
      a buffer coupled with the bi-level signal output and having a transition pattern output comprising sequential sets of the bi-level symbols obtained from the bi-level symbol stream; and
      a classifier comprising:
         a transition pattern input coupled with the transition pattern output; and
         a filtered data output coupled with the filtered data input, the filtered data output comprising the indication,
      wherein the indication is generated by classifying each transition pattern as a non-jittery pattern when the transition pattern is determined not to yield at least a statistical threshold of incorrect phase error determinations according to the predefined filtering schema, the bi-level symbol associated with the UI determined to yield non-jittery phase error determination when the bi-level symbol is part of one of the transition patterns classified as a non-jittery pattern.

16. The system of claim 15, wherein the pattern detector further comprises:
   a lookup table comprising the predefined filtering schema as a plurality of stored transition pattern models, each transition pattern model pre-classified as a jittery pattern or a non-jittery pattern,
   wherein the indication is generated by classifying each transition pattern as a non-jittery pattern by comparing the transition pattern to the lookup table to determine whether the transition pattern corresponds to a pre-classified non-jittery pattern.

17. The system of claim 13, further comprising:
   a sampling clock comprising:
      a phase adjustment input coupled with the phase error determination output; and
      a clock signal output that comprises the recovered sampling clock, the phase of the recovered sampling clock advanced, retarded, or maintained according to the phase adjustment input.

18. The system of claim 13, wherein the multi-level encoding scheme is a four-level pulse amplitude modulation (PAM4) encoding scheme.

19. The system of claim 13, further comprising:
   a baud-rate non-return-to-zero (NRZ) clock recovery circuit comprising the phase error computer.

20. The system of claim 13, further comprising:
   a receiver system of a serializer/deserializer (SERDES) comprising the multi-level data slicer, the symbol converter, the a multi-level error slicer, and the phase error computer.

* * * * *

UNITED STATES PATENT AND TRADEMARK OFFICE
CERTIFICATE OF CORRECTION

PATENT NO. : 10,142,089 B2
APPLICATION NO. : 15/466469
DATED : November 27, 2018
INVENTOR(S) : Yuhan Yao et al.

It is certified that error appears in the above-identified patent and that said Letters Patent is hereby corrected as shown below:

In the Specification

Column 2, Line 35, delete "$\beta(t);$" and insert therefor --$\gamma(t);$--.

Column 7, Line 14, delete "$\gamma(k+t)\Sigma n$" and insert therefor --$\gamma(k+t)=\Sigma n$--.

Column 7, Line 40, delete "a" and insert therefor --$\alpha$--.

Column 8, Line 28, delete "vise" and insert therefor --vice--.

In the Claims

Column 24, Line 58, Claim 20 delete "the a" and insert therefor --the--.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*